(12) United States Patent
Arimatsu

(10) Patent No.: US 9,052,699 B2
(45) Date of Patent: Jun. 9, 2015

(54) METHOD OF MANUFACTURING PIEZOELECTRIC VIBRATION REED, PIEZOELECTRIC VIBRATION REED, PIEZOELECTRIC VIBRATOR, OSCILLATOR, ELECTRONIC INSTRUMENT, AND RADIO TIME PIECE

(71) Applicant: Seiko Instruments Inc., Chiba (JP)

(72) Inventor: Daishi Arimatsu, Chiba (JP)

(73) Assignee: SII CRYSTAL TECHNOLOGY INC., Chiba (JP)

(*) Notice: Subject to any disclaimer, the term of this patent is extended or adjusted under 35 U.S.C. 154(b) by 342 days.

(21) Appl. No.: 13/630,103

(22) Filed: Sep. 28, 2012

(65) Prior Publication Data

US 2013/0082576 A1   Apr. 4, 2013

(30) Foreign Application Priority Data

Sep. 30, 2011   (JP) ................. 2011-218238

(51) Int. Cl.
| | |
|---|---|
| *H01L 41/22* | (2013.01) |
| *H01L 41/00* | (2013.01) |
| *G04R 20/00* | (2013.01) |
| *G04R 20/10* | (2013.01) |
| *H03H 3/04* | (2006.01) |
| *H03H 9/10* | (2006.01) |
| *H03H 9/21* | (2006.01) |

(52) U.S. Cl.
CPC ................ *G04R 20/00* (2013.01); *G04R 20/10* (2013.01); *H03H 3/04* (2013.01); *H03H 9/1021* (2013.01); *H03H 9/21* (2013.01); *H03H 2003/0492* (2013.01)

(58) Field of Classification Search
CPC ........ H01L 41/09; H03H 9/1021; H03H 3/04; H03H 2003/0492; G04R 20/00
USPC ..................................... 216/13, 17
See application file for complete search history.

(56) References Cited

FOREIGN PATENT DOCUMENTS

| JP | 2002-261558 | | 9/2002 | |
|---|---|---|---|---|
| JP | 2005-167992 | | 6/2005 | |
| JP | 2005167992 A | * | 6/2005 | ............. H03H 9/215 |

OTHER PUBLICATIONS

Machine Translation of JP,2005-167992,A, 12 pages, translated Dec. 12, 2014.*

* cited by examiner

*Primary Examiner* — Duy Deo
*Assistant Examiner* — Mahmoud Dahimene
(74) *Attorney, Agent, or Firm* — Brinks Gilson & Lione

(57) ABSTRACT

A method of manufacturing a piezoelectric vibration reed is provided. The piezoelectric vibration reed includes a pair of vibrating arm portions and a base portion. The pair of vibrating arm portions is disposed in parallel to each other. The base portion is configured to integrally support proximal end portions of the pair of vibrating arm portions in a longitudinal direction of the vibrating arm portions. The method of manufacturing the piezoelectric vibration reed forms a slit-shaped notched portion at a crotch portion located between the proximal end portions of the pair of vibrating arm portions.

5 Claims, 22 Drawing Sheets

| sample | RELATED ART | INVENTION |
|---|---|---|
| 1 | 0.5 | 0.3 |
| 2 | DAMAGE | -0.5 |
| 3 | -0.1 | -0.2 |
| 4 | 0.0 | -1.0 |
| 5 | DAMAGE | 0.2 |
| 6 | -0.7 | 0.5 |
| 7 | DAMAGE | -0.1 |
| 8 | 3.1 | -1.1 |
| 9 | 2.6 | -1.1 |
| 10 | DAMAGE | 2.0 |
| 11 | 7.1 | 0.8 |
| 12 | -0.8 | 0.2 |
| 13 | -0.8 | 0.2 |
| 14 | DAMAGE | 0.1 |
| 15 | -0.6 | 1.5 |
| 16 | -0.5 | 0.1 |
| 17 | -0.7 | -0.1 |
| 18 | DAMAGE | -0.2 |
| 19 | DAMAGE | -0.3 |
| 20 | 0.2 | 0.2 |
| 21 | 0.2 | -0.2 |
| 22 | 5.5 | 0.6 |

F SHIFT AMOUNT HISTOGRAM
( 22pcs, AFTER 200cm THREE TIMES DROPS )

| | RELATED ART | INVENTION |
|---|---|---|
| NUMBER OF DAMAGED PIEZOELECTRIC VIBRATORS | 7 | 0 |
| SURVIVED NUMBER | 15 | 22 |
| RATE OF DAMAGED PIEZOELECTRIC VIBRATORS | 31.8 | 0.0 |

COMPARISON OF RATE OF DAMAGED PIEZOELECTRIC VIBRATORS ( 22pcs, AFTER 200cm THREE TIMES DROPS )

METHOD OF MANUFACTURING
PIEZOELECTRIC VIBRATION REED,
PIEZOELECTRIC VIBRATION REED,
PIEZOELECTRIC VIBRATOR, OSCILLATOR,
ELECTRONIC INSTRUMENT, AND RADIO
TIME PIECE

RELATED APPLICATIONS

This application claims priority under 35 U.S.C. §119 to Japanese Patent Application No. 2011-218238 filed on Sep. 30, 2011, the entire content of which is hereby incorporated by reference.

BACKGROUND OF THE INVENTION

1. Technical Field

The present invention relates to a method of manufacturing a piezoelectric vibration reed, a piezoelectric vibration reed, a piezoelectric vibrator, an oscillator, an electronic instrument, and a radio time piece.

2. Description of the Related Art

In mobile phones or portable information terminal equipment, a piezoelectric vibrator having a piezoelectric vibration reed formed of a piezoelectric material such as crystal is known as a device used for a time-of-day source, a timing source such as a control signal, or a reference signal source.

There are various types of piezoelectric vibration reeds described above are known. Known examples of such piezoelectric vibration reed include a tune-fork type piezoelectric vibration reed 100 having a pair of vibrating arm portions 110 disposed in parallel, to each other, and a base portion 120 which supports a proximal end portion of the vibrating arm portions 110 in an cantilevered manner as shown in FIG. 27. The piezoelectric vibration reed 100 is capable of vibrating the pair of vibrating arm portions 110 in the direction toward and away from each other (the direction indicated by arrows in the drawing) at a predetermined resonant frequency by applying a voltage to an excitation electrode, not shown, formed on surfaces of the pair of vibrating arm portions 110.

Incidentally, the contour of the piezoelectric vibration reed 100 is formed generally by performing an etching process on a wafer substrate formed of crystal or the like. This point will be described in brief. An etching protection film is formed on a surface of the wafer substrate, and then the etching protection film 210 on a wafer substrate 200 is patterned into contours of the piezoelectric vibration reeds 100 using Photolithography technology as shown in FIG. 28. Subsequently, using the patterned etching protection film 210 as a mask, the piezoelectric vibration reed 100 shown in FIG. 27, which includes the pair of vibrating arm portions 110 supported by the base portion 120 in a cantilevered manner, is obtained by performing the etching process on the wafer substrate 200 by Wet Etching as shown in FIG. 29.

However, when performing the etching process by Wet Etching, the speed of etching the wafer substrate 200 varies depending on the directions of the crystal axes, which is a phenomenon so-called an etching anisotropy. More specifically, in the respective crystal axes of the crystal (X-axis, Y-axis, and Z-axis), the etching speed is lowered in the order of Z-axis, +X axis, –X axis, Y-axis. Therefore, by the influence of the etching anisotropy, etching residuals are likely to be generated when the contours are formed, so that the contours of the piezoelectric vibration reeds 100 are likely to have irregular shapes. In particular, as shown in FIG. 27 and FIG. 30, etching residuals 116 are likely to be generated at a crotch portion 115 of the proximal end portions of the pair of vibrating arm portions 110 (the base portion).

This point will be described.

Normally, when forming the tuning-fork type piezoelectric vibration reed 100, the wafer substrate 200 is cut out from a crystal raw stone so that the Z-axis of the crystal axis substantially matches the thickness direction (L1 direction) of the piezoelectric vibration reed 100, the Y-axis matches the longitudinal direction (L2 direction) of the piezoelectric vibration reed 100, and the X-axis matches the width direction (L3 direction) of the piezoelectric vibration reed 100 for the purpose of obtaining desired contour by the etching process as shown in FIG. 27. However, since the etching speed varies by any means, the etching residuals 116 are likely to be generated at the crotch portion 115 between the pair of vibrating arm portions 110 as shown in FIG. 31.

In particular, as the etching process is proceeded and the point being processed approaches the portion of the crotch portion 115, a flow of etching solution is impaired by the etching protection film 210 so that the reaction of etching becomes slow. Therefore, the speed of procession of the etching process in the Y-axis direction, in which the etching speed becomes the slowest, is further lowered, whereby the etching residuals 116 are likely to be generated.

If the etching residuals 116 are generated at the crotch portion 115, the pair of vibrating arm portions 110 are resulted in unbalanced vibrations, which may result, in turn, in an increased CI value due to a change of vibration characteristics and a vibration leak.

Accordingly, by devising the shape of the etching protection film corresponding to the crotch portion while taking the difference in etching speed into account in advance, a technology to adjust the vibration balance of the pair of vibrating arm portions is known (JP-A-2005-167992).

However, even when the technology described in JP-A-2005-167992 is employed, the etching residual itself still remains significantly. Therefore, a stress tends to concentrate on coupling portions between portions of the etching residuals and the vibrating arm portions at the time of vibrations for example, and the lowering of the strength of portions where the stress is concentrated is resulted. Consequently, the corresponding portions may become a starting point of damage caused by the external impact or the like, so that the vibrating arm portions are susceptible to cracks or the like.

In addition, the etching residual may work to change the length of the pair of the vibrating arm portions, so that the change of the variation characteristic such as shifting of the resonant frequency is still likely to occur.

It is believed that the etching residuals may be reduced by performing Wet Etching for a long time. However, the time to be used for etching is increased, and hence lowering of the productivity is resulted. Furthermore, since the period to be soaked into the etching solution, which is drug solution, may increase as well, a problem that the etching protection film becomes eroded and hence a desirable etching process cannot be performed, so that the vibration characteristics may deteriorate.

SUMMARY OF THE INVENTION

In view of such circumstances, it is an object of the invention to provide a high-quality piezoelectric vibration reed having less etching residuals at a crotch portion located between a pair of vibrating arm portions, providing stable vibration characteristics, and being resistant to damage of the vibrating arm portions due to an external impact, and a method of manufacturing such a piezoelectric vibration reed.

It is another object of the invention to provide a piezoelectric vibrator having such a piezoelectric vibration reed, an oscillator, an electronic instrument, and a radio timepiece having such a piezoelectric vibrator.

In order to solve the problems as described above, one embodiment a method of manufacturing a piezoelectric vibration reed includes a contour forming step for performing an etching process on a piezoelectric wafer and forming a contour of the piezoelectric vibration reed from the piezoelectric wafer. The piezoelectric vibration reed includes a pair of vibrating arm portions disposed in parallel to each other with a center axis interposed therebetween and a base portion configured to integrally support proximal end portions of the pair of vibrating arm portions in the longitudinal direction in a cantilevered manner. The contour forming step includes a mask pattern forming step for forming etching protection films on both main surfaces of the piezoelectric wafer and forming a mask pattern corresponding to a contour of the piezoelectric vibration reed from the etching protection film by Photolithography technology. The contour forming step further includes an etching step for performing an etching process on the piezoelectric wafer by Wet Etching from both main surface sides using the mask pattern as a mask, wherein during the mask pattern forming step, a slit-shaped notched portion extending toward the base portion side along the longitudinal direction of the pair of vibrating arm portions is formed on the mask pattern at a crotch-portion-corresponding portion for forming a crotch portion located between the proximal end portions of the pair of vibrating arm portions.

In this embodiment, since etching solution comes in contact with areas of the piezoelectric wafer, which are not masked by the mask pattern, the etching process proceeds by a chemical reaction. Accordingly, the etching process can be performed on the piezoelectric wafer along the shape of the mask pattern, so that the contour of the piezoelectric vibration reed is formed.

Incidentally, by the flowing etching solution coming into contact with the piezoelectric wafer from point to point, the etching process described above is performed smoothly, and formation of the contour of the piezoelectric vibration reed is gradually in progress. However, since the pair of vibrating arm portions are arranged in parallel at a small distance, the etching solution can hardly flow between the pair of vibrating arm portions. In particular, since an area of the mask pattern surrounded from three sides by arm-portion-corresponding portions corresponding to the vibrating arm portions and the crotch-portion-corresponding portion corresponding to the crotch portion is to be etched as the progress of the etching process approaches the crotch portion, it is contemplated that the etching solution can hardly flow.

However, since the notched portions are formed on the crotch-portion-corresponding portion in the mask pattern, the etching solution can easily flow in the longitudinal direction of the pair of vibrating arm portions along the notched portions. Therefore, the speed of the progress of the etching process along the longitudinal direction in the direction toward the crotch-portion-corresponding portion can be increased. Therefore, the etching process is prevented from proceeding in accordance with the difference in etching speed depending on the direction of the crystal axis of the piezoelectric wafer, so that the etching process can be proceeded positively toward the crotch-portion-corresponding portion.

Consequently, even though the period of the etching process is the same as that of the related art, the etching residuals on the crotch portion located between the proximal end portions of the pair of vibrating arm portions are reduced in comparison with the related art. Therefore, occurrence of the stress concentration caused by the etching residuals is inhibited, and the high-quality piezoelectric vibration reed which is resistant to damage of the vibrating arm portions due to the external impact or the like is obtained. Since the problem that the lengths of the vibrating arm portions are changed by the etching residuals can hardly occur, stable vibration characteristics may be demonstrated.

Alternatively, or additionally, the notched portion has a constant notched width along the entire notched length. In this case, the etching solution can be flowed in the longitudinal direction of the pair of vibrating arm portions along the notched portion further stably and smoothly. Therefore, the etching process can be proceeded toward the crotch-portion-corresponding portion more positively, and the etching residuals on the crotch portion can further be reduced.

Alternatively, or additionally, the notched portion is formed along the center axis. In this case, since the notched portion is formed along the center axis located between the pair of vibrating arm portions (that is, the center axis in the width direction of the piezoelectric vibration reed), not only an effect that the etching residuals on the crotch portion may be reduced, but also an effect that positional deviation of the etching residuals to either one of the vibrating arm portions can be prevented easily are achieved.

In another embodiment of a method of manufacturing a piezoelectric vibration reed include forming etching protection films on both main surfaces of the piezoelectric wafer and forming a mask pattern corresponding to a contour of the piezoelectric vibration reed from the etching protection film by using Photolithography technology. The contour of the piezoelectric vibration has a pair of vibrating arm portions disposed in parallel to each other with a center axis interposed therebetween; a base portion configured to integrally support proximal end portions of the pair of vibrating arm portions in a longitudinal direction of the vibrating arm portions; and a connection portion between the proximal end portions of the pair of vibrating arm portion and the base portion. The method further includes etching the piezoelectric wafer by Wet Etching from both main surface sides using the mask pattern as a mask, the etching step comprising removing etching residuals remained on the crotch portion; and forming a notched portion by removing some of the base portion in a width direction toward a center of the piezoelectric vibration reed, the notched portion extending through the base portion, the step of forming the notched portion further comprising determining a width and a length of the notched portion based on a curvature R of the crotch portion.

Another embodiment of the present invention is a piezoelectric vibration reed manufactured by the method of manufacturing the piezoelectric vibration reed described above.

In this embodiment of the piezoelectric vibration reed, since the etching residuals on a crotch portion located between a pair of vibrating arm portions are smaller than that of the related art, a high-quality piezoelectric vibration reed providing stable vibration characteristics, and being resistant to damage of the vibrating arm portions due to an external impact is provided.

Another further embodiment is a piezoelectric vibrator which includes the piezoelectric vibration reed described in the above embodiments, and a package having a base substrate and a lid substrate coupled to each other and configured to accommodate the piezoelectric vibration reed in a cavity formed between the both substrates.

The piezoelectric vibration reed described in the above embodiments, since the high-quality piezoelectric vibration reed providing stable vibration characteristics and being resistant to damage of the vibrating arm portions due to the external impact is provided, the high-quality piezoelectric vibration reed improved in reliability in operation and durability is provided.

Another further embodiment is an oscillator which includes the above-described piezoelectric vibrator that is electrically connected to an integrated circuit as an oscillating element.

Another embodiment is an electronic instrument having the above-described piezoelectric vibrator that is electrically connected to a clocking unit.

Another embodiment is a radio timepiece where the above-described piezoelectric vibrator is electrically connected to a filter portion.

According to the oscillator, the electronic instrument, and the radio time piece in the embodiments, since the piezoelectric vibrator described above is provided, reliability in operation and durability are improved in the same manner.

According to the above-described embodiments, a high-quality piezoelectric vibration reed having less etching residuals at a crotch portion located between a pair of vibrating arm portions, providing stable vibration characteristics, and being resistant to damage of the vibrating arm portions due to an external impact is provided.

Figure 1:
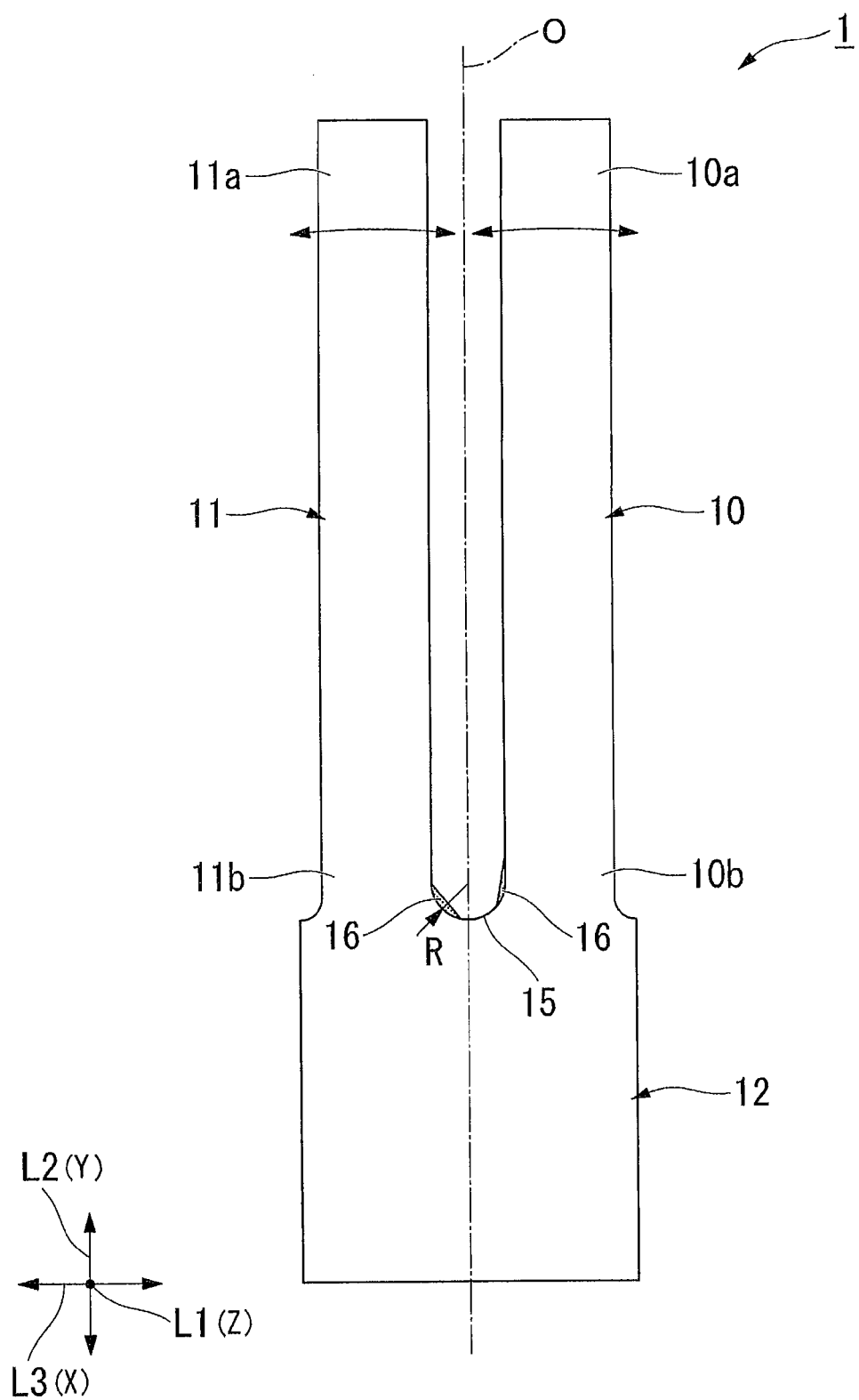
FIG. 1 is a plan view showing an embodiment of a piezoelectric vibration reed according to the invention.

DESCRIPTION OF THE PREFERRED EMBODIMENTS (Piezoelectric Vibration Reed)

Referring now to the drawings, an embodiment of a piezoelectric vibration reed according to the invention will be described below.

As shown in FIG. 1, a piezoelectric vibration reed 1 of this embodiment is a turning-fork type vibration reed formed of a piezoelectric material such as crystal, lithium tantalate, or lithium niobate, and is configured to vibrate when a predetermined voltage is applied.

The piezoelectric vibration reed 1 includes a pair of vibrating arm portions 10 and 11 arranged in parallel to each other and having distal end portions 10a and 11a as free ends and a base portion 12 configured to integrally support proximal end portions 10b and 11b side (the side of the base portions) of the pair of vibrating arm portions 10 and 11 in a cantilevered manner.

The pair of vibrating arm portions 10 and 11 are arranged so as to extend in a line symmetry with a center axis O interposed therebetween, have a constant width in the width direction, and extend along the center axis O. The base portion 12 is a member configured to support the proximal end portions 10b and 11b sides of the pair of vibrating arm portions 10 and 11 in a cantilevered manner as described above, and functions as a mount member used when mounting the piezoelectric vibration reed 1.

A portion located between the proximal end portions 10b and 11b of the pair of vibrating arm portions 10 and 11 corresponds to a crotch portion 15. In the illustrated example, a coupled portion between the proximal end portions 10b and 11b of the pair of vibrating arm portions 10 and 11 and the base portion 12 is curved at a curvature R, and hence the crotch portion 15 is formed into a U-shape in plan view when viewed in the thickness direction.

Also, the pair of vibrating arm portions 10 and 11 are formed with excitation electrodes, not shown, configured to vibrate the pair of vibrating arm portions 10 and 11 on outer surfaces thereof. The base member 12 is formed with mount electrodes, not shown, on outer surface thereof in a state of being in conduction with the excitation electrode. Then, when a predetermined voltage is applied to the excitation electrode via the mount electrode, the pair of vibrating arm portions 10 and 11 vibrate in the direction toward and away from each other (the direction indicated by arrows in FIG. 1) at a predetermined resonant frequency due to a mutual action of the both electrodes.

Figure 2:
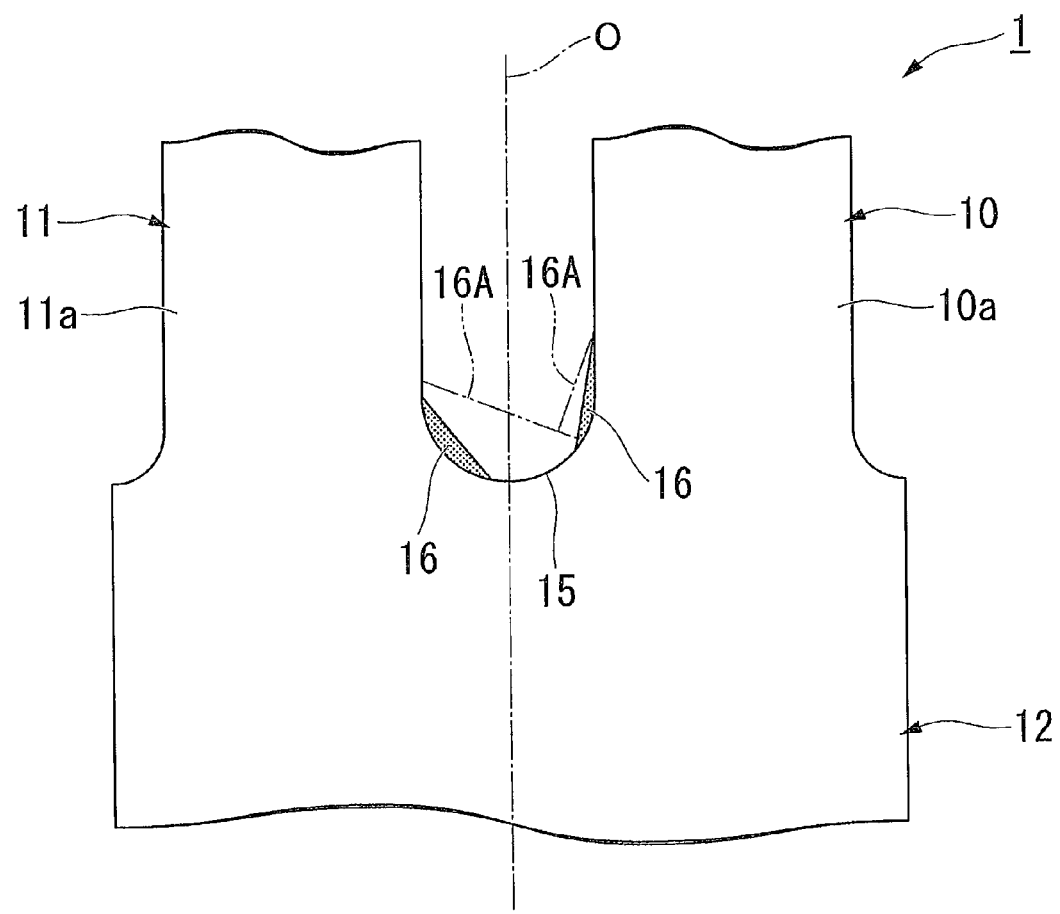
FIG. 2 is an enlarged view of a crotch portion of the piezoelectric vibration reed shown in FIG. 1.

Incidentally, the piezoelectric vibration reed 1 of this embodiment is manufactured by etching a piezoelectric wafer, described later, by Wet Etching and forming a contour thereof. However, as shown in FIG. 1 and FIG. 2, there slightly remains etching residuals 16 at the crotch portion 15 described above. However, these etching residuals 16 are much less than the portion of the etching residuals 16A of the related art indicated by a dot line and, in addition, are not formed over the entire part of the crotch portion 15 so as to connect the proximal end portions 10b and 11b of the pair of vibrating arm portions 10 and 11 and are disconnected in the vicinity of the center axis O.

(Method of Manufacturing a Piezoelectric Vibration Reed)

Figure 3:
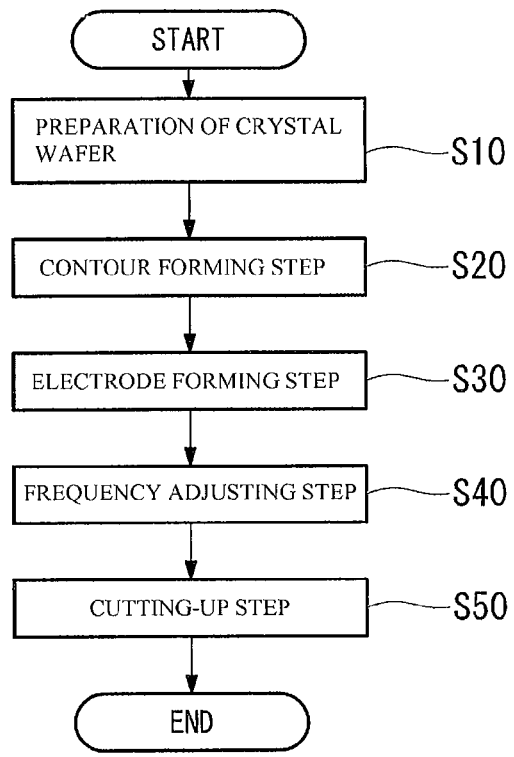
FIG. 3 is a flowchart showing a flow of manufacturing the piezoelectric vibration reed shown in FIG. 1.
Figure 4:
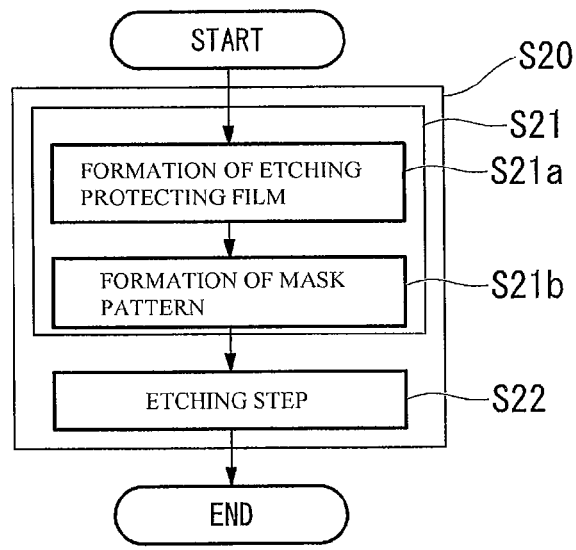
FIG. 4 is a flowchart showing a flow of manufacturing the piezoelectric vibration reed shown in FIG. 1.

Subsequently, a method of manufacturing the piezoelectric vibrator 1 described above will be described with reference to flowcharts in FIG. 3 and FIG. 4. In this embodiment, a case where a crystal wafer is employed as the piezoelectric wafer will be described as an example.

The method of manufacturing the piezoelectric vibration reed 1 of this embodiment includes a contour forming step (S20) for forming contours of a plurality of the piezoelectric vibration reeds 1 from a crystal wafer 20 by etching the crystal wafer 20 by Wet Etching after a preparation (S10) of the crystal wafer 20 (see FIG. 5), an electrode forming step (S30) for forming respective electrodes on each of the piezoelectric vibration reeds 1 after the formation of the contours, a frequency adjusting step (S40) for adjusting resonant frequencies of the respective piezoelectric vibration reeds 1, and a cutting-up step (S50) for cutting off the respective piezoelectric vibration reeds 1 from the crystal wafer 20.

The respective steps will be described in detail below.

First of all, Lambert row stone of crystal is sliced at a predetermined angle, so that the crystal wafer 20 having a certain thickness is obtained. In this case, the crystal wafer 20 is formed by performing the slicing as described above so that a Z-axis of the crystal axis substantially matches the direction of the thickness (L1 direction) of the piezoelectric vibration reed 1 shown in FIG. 1, a Y-axis matches the length direction (L2 direction) of the piezoelectric vibration reed 1, and an X-axis matches the width direction (L3 direction) of the piezoelectric vibration reed 1.

Then, by lapping and polishing the crystal wafer 20, the crystal wafer 20 having a predetermined thickness finished in high degree of accuracy is prepared (S10).

Subsequently, the contour forming step (S20) is performed.

The contour forming step (S20) includes a mask pattern forming step (S21) for forming the etching protecting films 21 (see FIG. 5) on both main surfaces of the crystal wafer 20, and forming a mask pattern 22 (see FIG. 6) corresponding to the contours of the piezoelectric vibration reeds 1 from the etching protecting film 21 by Photolithography technology and an etching step (S22) for performing an etching process on the both main surfaces sides of the crystal wafer 20 by Wet Etching using the mask pattern 22 as a mask.

Figure 5:
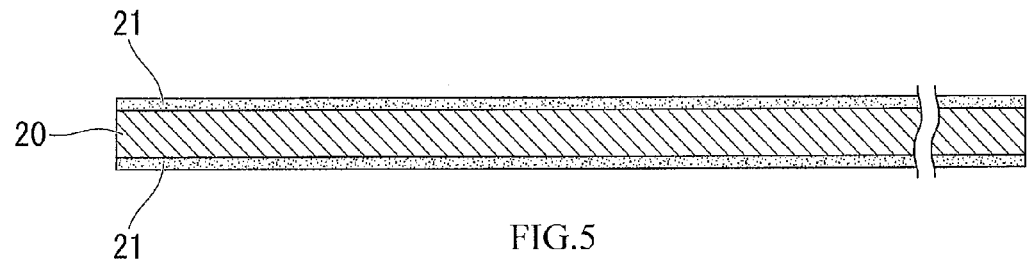
FIG. 5 is a drawing showing a process of manufacturing piezoelectric vibration reeds and a state in which etching protection films are formed on both main surfaces of a crystal wafer.

In the mask pattern forming step (S21), as shown in FIG. 5, the etching protecting films 21 are formed on the both main surfaces of the crystal wafer 20 (S21a) first. Examples of the etching protecting film 21 include a metallic film formed by laminating a base film formed of chrome, for example, and a finishing film formed of gold one one top of another, and is formed by film formation on the basis of a sputtering method or an evaporation method.

Then, the etching protecting film 21 is patterned to form the mask pattern 22 corresponding to the contours of the piezoelectric vibration reeds 1 (S21b).

More specifically, a photo resist film, not shown, is formed on the etching protecting film 21, and then the photo resist film is patterned so as to form a contour of the piezoelectric vibration reed 1, for example by a general photoresist technology. Then, the etching process is performed using the photo resist film as a mask, and portions of the etching protecting film 21 which is not masked are selectively removed. Then, after the etching process, the photo resist film used as the mask is removed.

Figure 6:
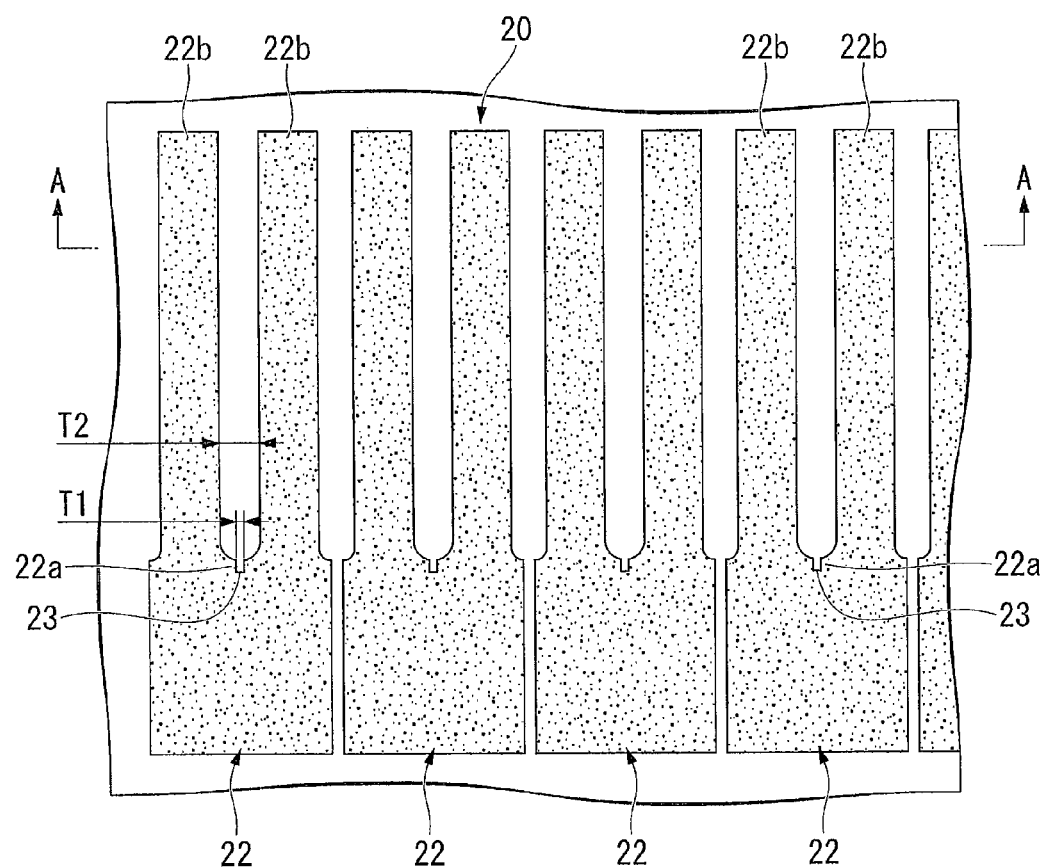
FIG. 6 is a drawing showing a state in which the etching protection film shown in FIG. 5 is patterned and a mask pattern is formed.
Figure 7:
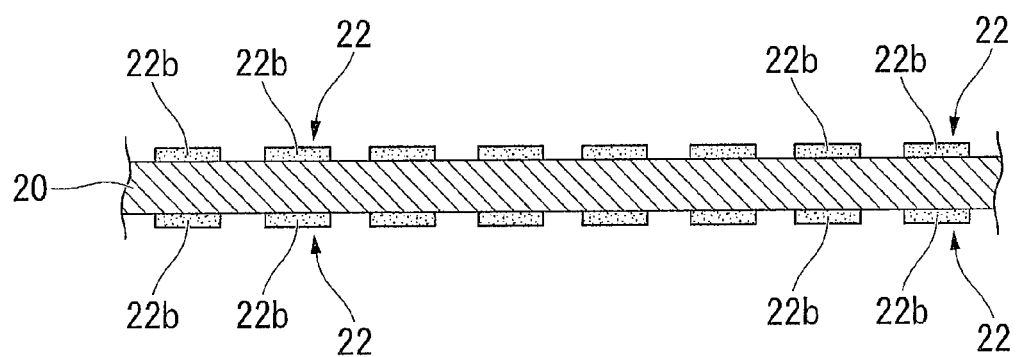
FIG. 7 is a cross-sectional view taken along the line A-A in FIG. 6.

Accordingly, as shown in FIG. 6 and FIG. 7, the mask pattern 22 patterned into the contours of the above-described piezoelectric vibration reed 1 is formed.

Incidentally, in this embodiment, when forming the mask pattern 22, notched portions 23 are formed at crotch-portion-corresponding portions 22a where the crotch portions 15 of the piezoelectric vibration reeds 1 are to be formed as shown FIG. 6. The notched portions 23 each are a slit-shaped notch extending toward the base portion 12 along the longitudinal direction (L2 direction) of the pair of vibrating arm portions 10 and 11, arranged so as to extend along the center axis O and having a constant notched width along the entire length of the notch.

In the illustrated example, a notched width T1 of the notched portions 23 is on the order of ⅓ a crotch width T2.

Then, the mask pattern forming step (S21) is terminated at this time point.

Subsequently, the etching step (S22) described above is performed.

Figure 8:
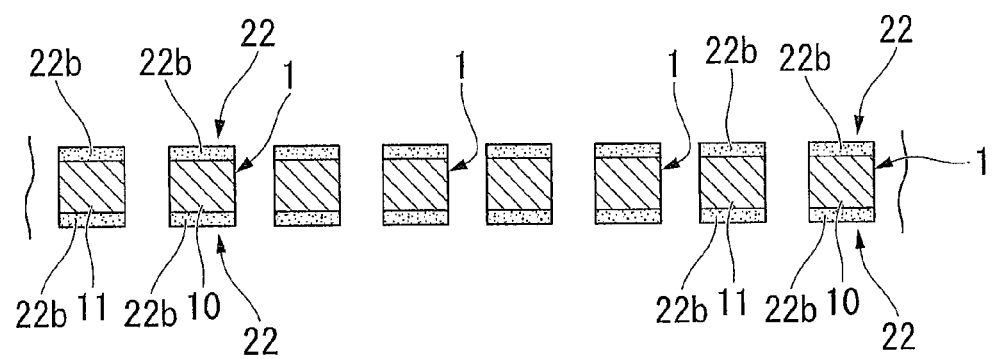
FIG. 8 is a drawing showing a state in which the crystal wafer is etched using the mask pattern shown in FIG. 6 as a mask.

Specifically, the crystal wafer 20 on which the etching protecting film 21 is patterned is soaked into etching solution (for example, fluorine system etching solution), not shown, for a predetermined period. Then, the etching solution comes into contact with the areas of the crystal wafer 20, which are not masked by the mask pattern 22, and hence the etching process proceeds by the chemical reaction. Accordingly, as shown in FIG. 8, the etching process can be performed on the crystal wafer 20 along the shape of the mask pattern 22, so that the contour of the piezoelectric vibration reed 1 is formed.

In particular, by the flowing etching solution coming into contact with the crystal wafer 20 from point to point, the etching process is performed smoothly, and formation of the contours of the piezoelectric vibration reeds 1 gradually proceeds. However, since the crystal wafer 20 is formed so that the Z-axis of the crystal axis substantially matches the thickness direction (L1 direction) of the piezoelectric vibration reed 1, the Y-axis thereof matches the longitudinal direction (L2 direction) of the piezoelectric vibration reed 1, and the X-direction thereof matches the width direction (L3 direction) of the piezoelectric vibration reed 1 as described above, the contour of the piezoelectric vibration reed 1 can be formed easily with high degree of accuracy.

The contour forming step (S20) is terminated at this time point.

The plurality of piezoelectric vibration reeds 1 are still in a state of being coupled to the crystal wafer 20 via coupling portions, not shown, until the cutting-up step (S50) to be performed later.

Subsequently, the electrode forming step (S30) for forming electrodes such as the excitation electrode is performed by forming a metallic film, not shown, on the respective piezoelectric vibration reeds 1 whose contours are formed, and then patterning the meal film by general Photolithography technique.

During this step, a weight metallic film, not shown, for adjusting the frequency is formed on the distal end portions 10a and 11a of the pair of vibrating arm portions 10 and 11 simultaneously with the formation of the electrodes. The weight metallic film includes a coarse adjustment film and a fine adjustment film.

Subsequently, the frequency adjusting step (S40) for coarsely adjusting the resonant frequency is performed using the coarse film of the weight metallic film. More specifically, the frequency adjusting step (S40) is performed by irradiating the coarse adjustment film with a laser beam, evaporating part of the coarse adjustment film and changing the weight of the coarse adjustment film. The fine adjustment for adjusting the resonant frequency with higher degree of accuracy is performed in a stage of being integrated into a package as the piezoelectric vibrator.

Finally, the cutting-up step (S50) for cutting the coupling portions and separating the piezoelectric vibration reeds 1 from the crystal wafer 20 into individual pieces is performed. Accordingly, the plurality of tuning-fork type piezoelectric vibration reeds 1 shown in FIG. 1 may be manufactured at once from a single crystal wafer 20.

Incidentally, during the etching step (S22) described above, since the pair of vibrating arm portions 10 and 11 are arranged at a small distance (the crotch width) in parallel to each other, the etching solution can hardly flow between the pair of vibrating arm portions 10 and 11. In particular, since an area of the mask pattern 22 surrounded from three sides by the arm-portion-corresponding portions 22b corresponding to the vibrating arm portions 10 and 11 and the crotch-portion-corresponding portion 22a corresponding to the crotch portion 15, is to be etched as the progress of the etching process approaches the crotch portion 15 as shown in FIG. 6 and FIG. 9, it is contemplated that the etching solution can hardly flow.

However, since the notched portions 23 described above are formed on the crotch-portion-corresponding portion 22a in the mask pattern 22 of this embodiment, the etching solution can easily flow in the longitudinal direction (L2 direction) of the pair of vibrating arm portions 10 and 11 along the notched portions 23.

Figure 9:
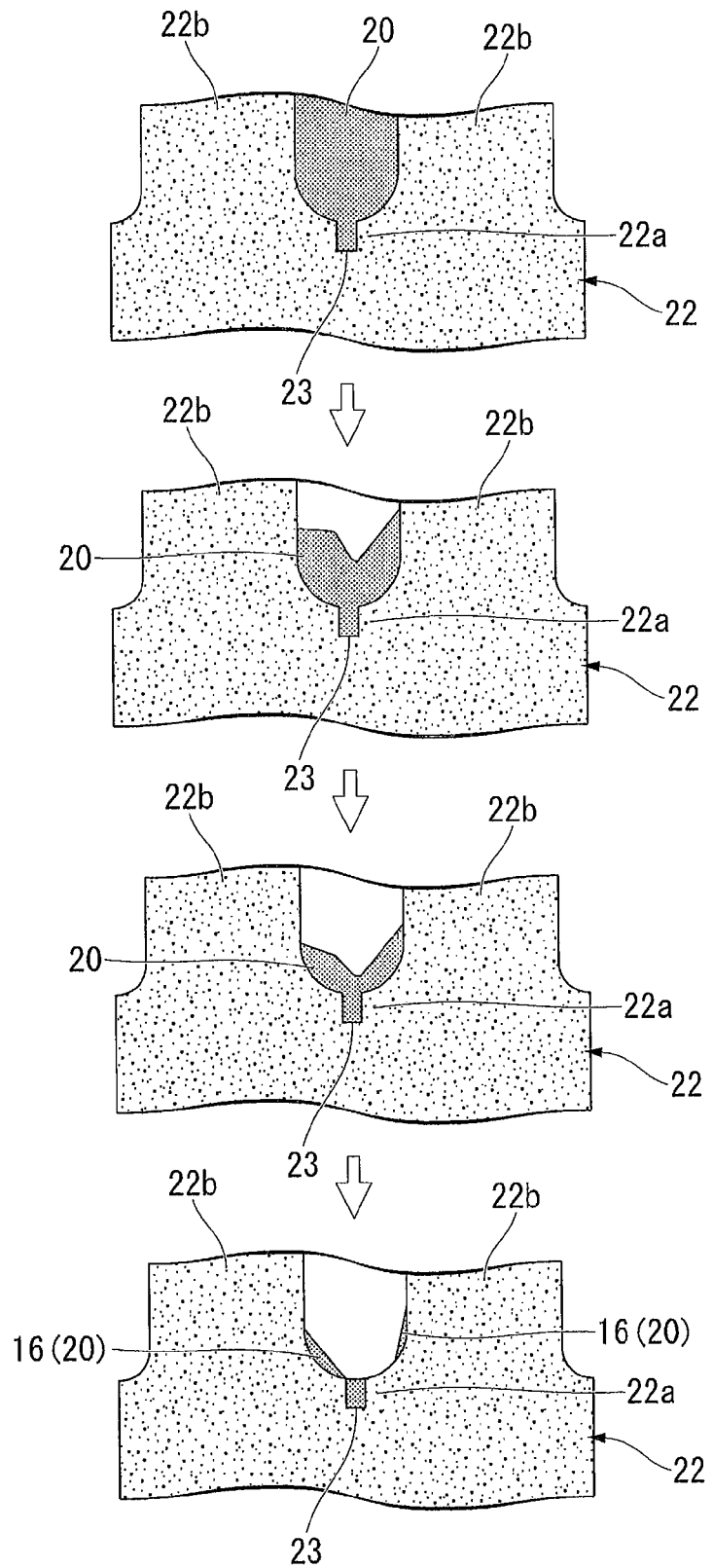
FIG. 9 is an enlarged view of a crotch-portion-corresponding portion of the mask pattern showing a state of progress of the etching.

Therefore, as shown in FIG. 9, the speed of the progress of the etching process along the longitudinal direction (L2 direction) in the direction toward the crotch-portion-corresponding portion 22a can be increased by an amount corresponding to the notched portions 23. Therefore, the etching process is prevented from proceeding in accordance with the difference in etching speed in the direction of the crystal axis of the crystal wafer 20, so that the etching process can proceed positively toward the crotch-portion-corresponding portion 22a. Therefore, the etching residuals 16 can hardly be remained on the crotch-portion-corresponding portion 22a.

Figure 27:
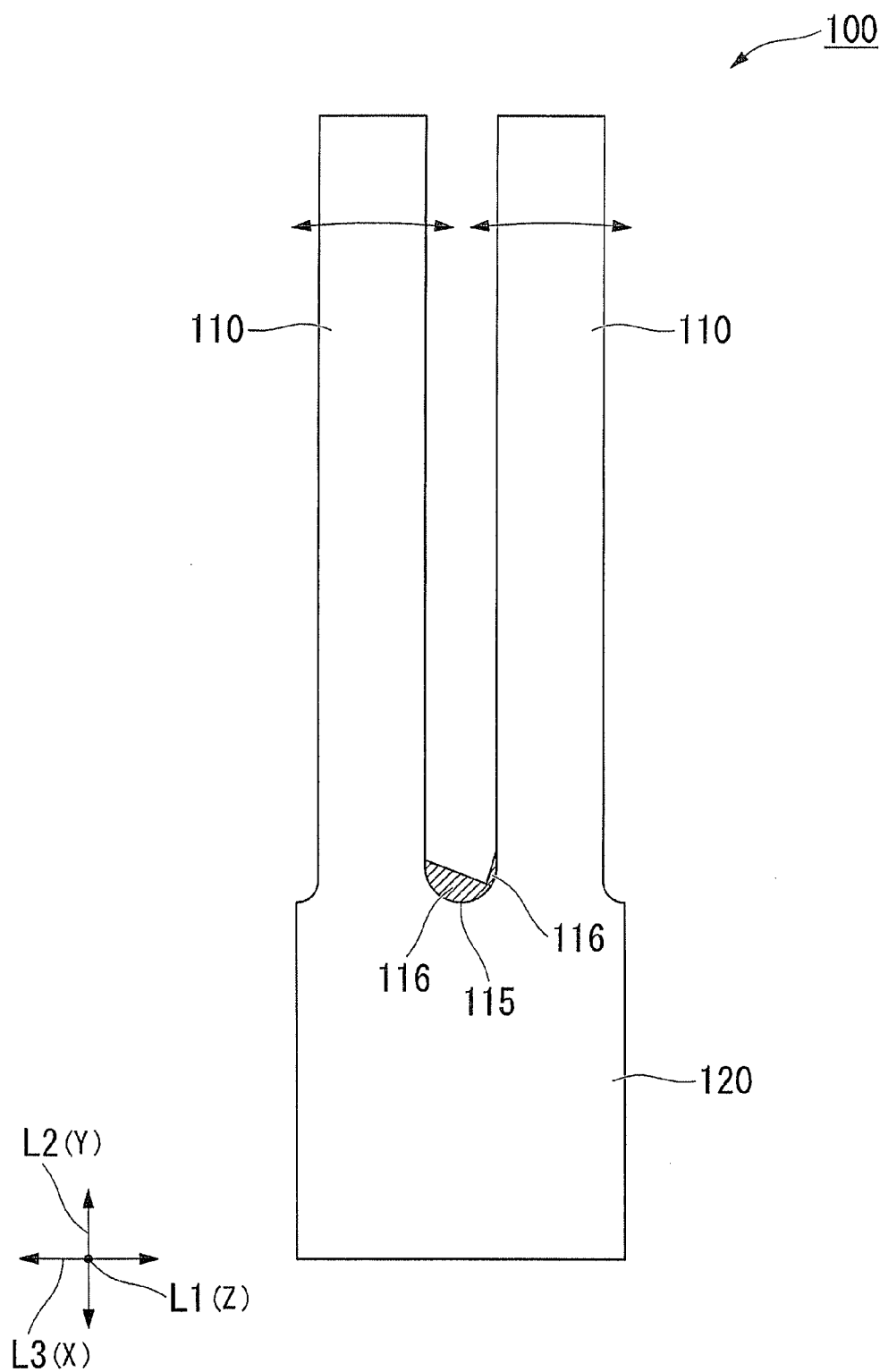
FIG. 27 is a plan view showing an example of the piezoelectric vibration reed of the related art.
Figure 28:
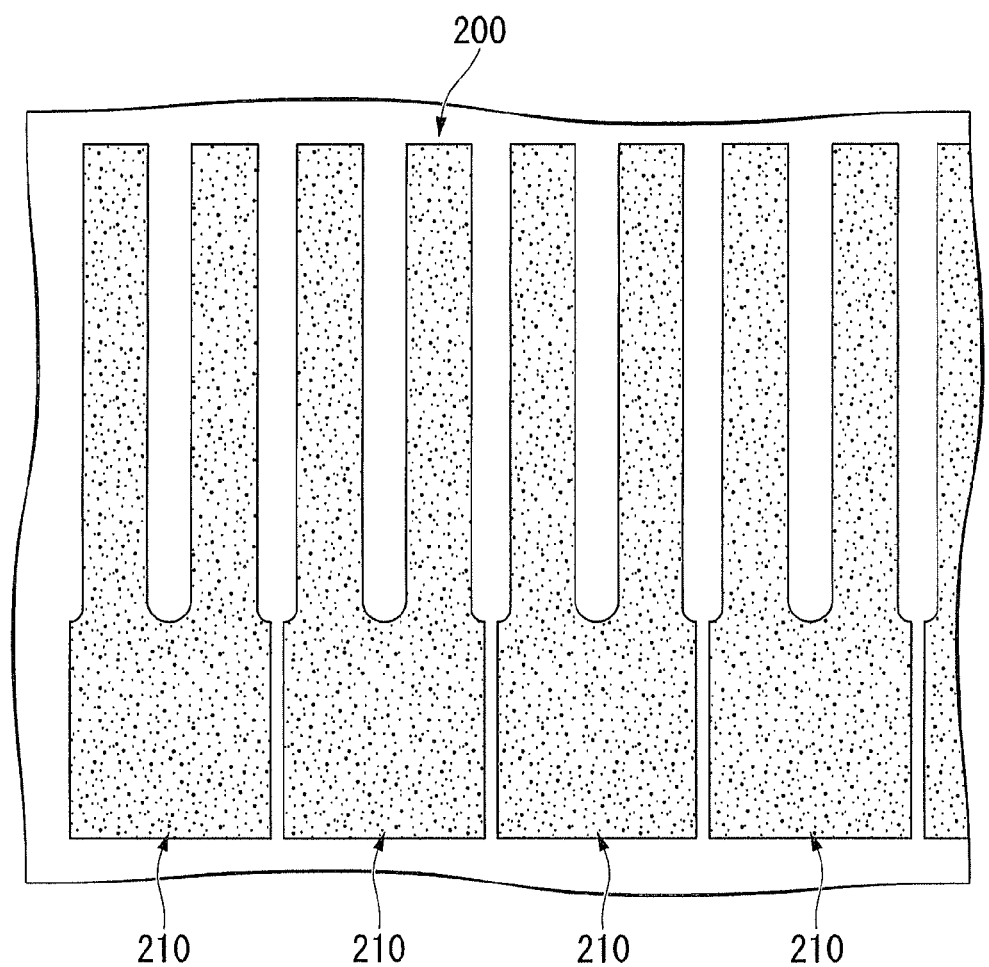
FIG. 28 is a drawing showing a process of manufacturing the piezoelectric vibration reeds shown in FIG. 27 and a state in which etching protection films are formed on the both main surfaces of the crystal wafer and then the etching protecting film is patterned.
Figure 29:
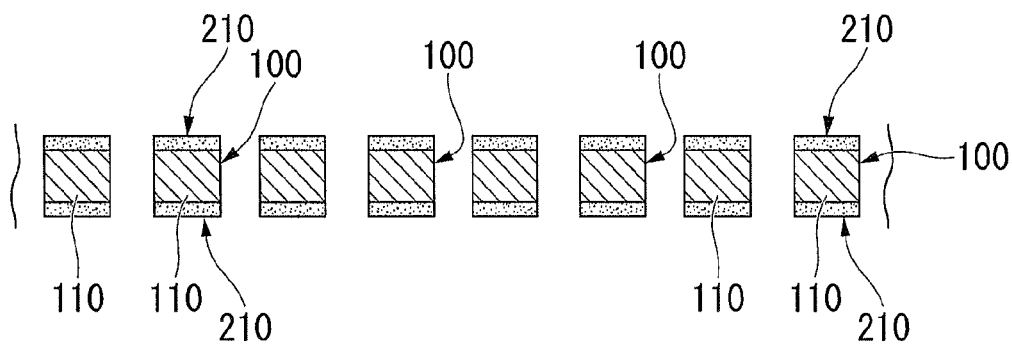
FIG. 29 is a drawing showing a state in which a crystal wafer is etched using the etching protecting film shown in FIG. 28 as a mask.
Figure 30:
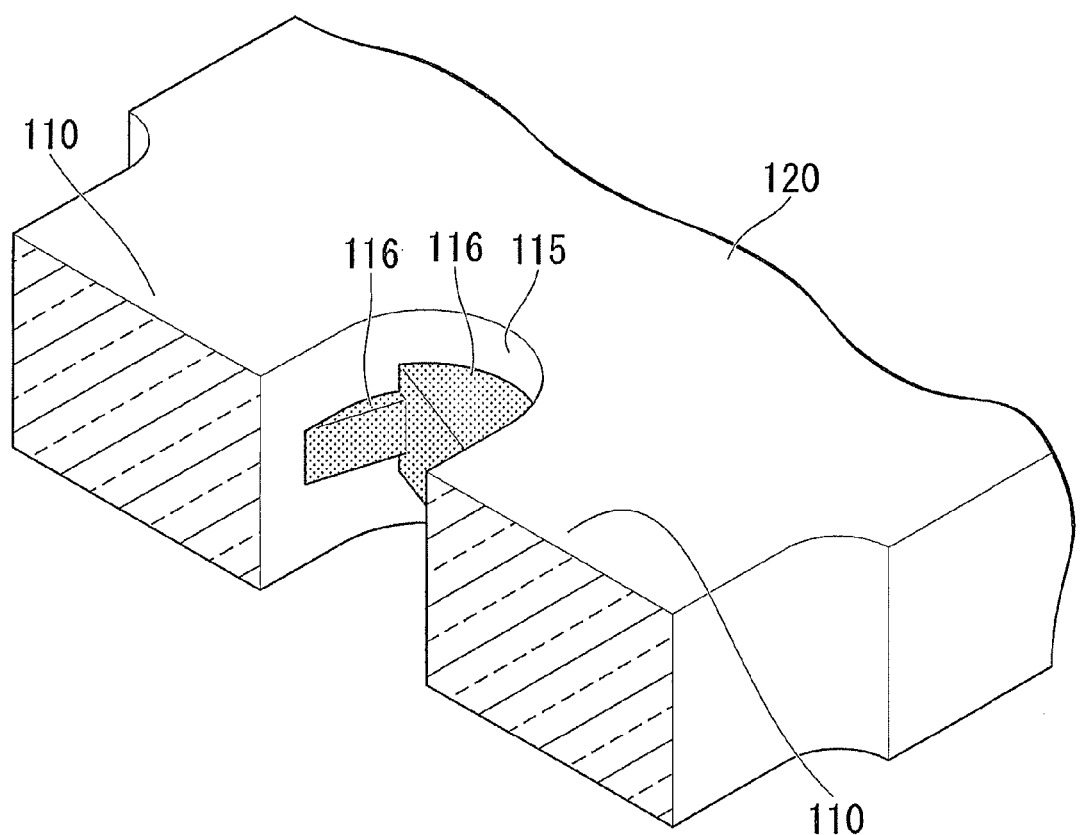
FIG. 30 is an enlarged perspective view showing a portion in the vicinity of a crotch portion of the piezoelectric vibration reed shown in FIG. 27.
Figure 31:
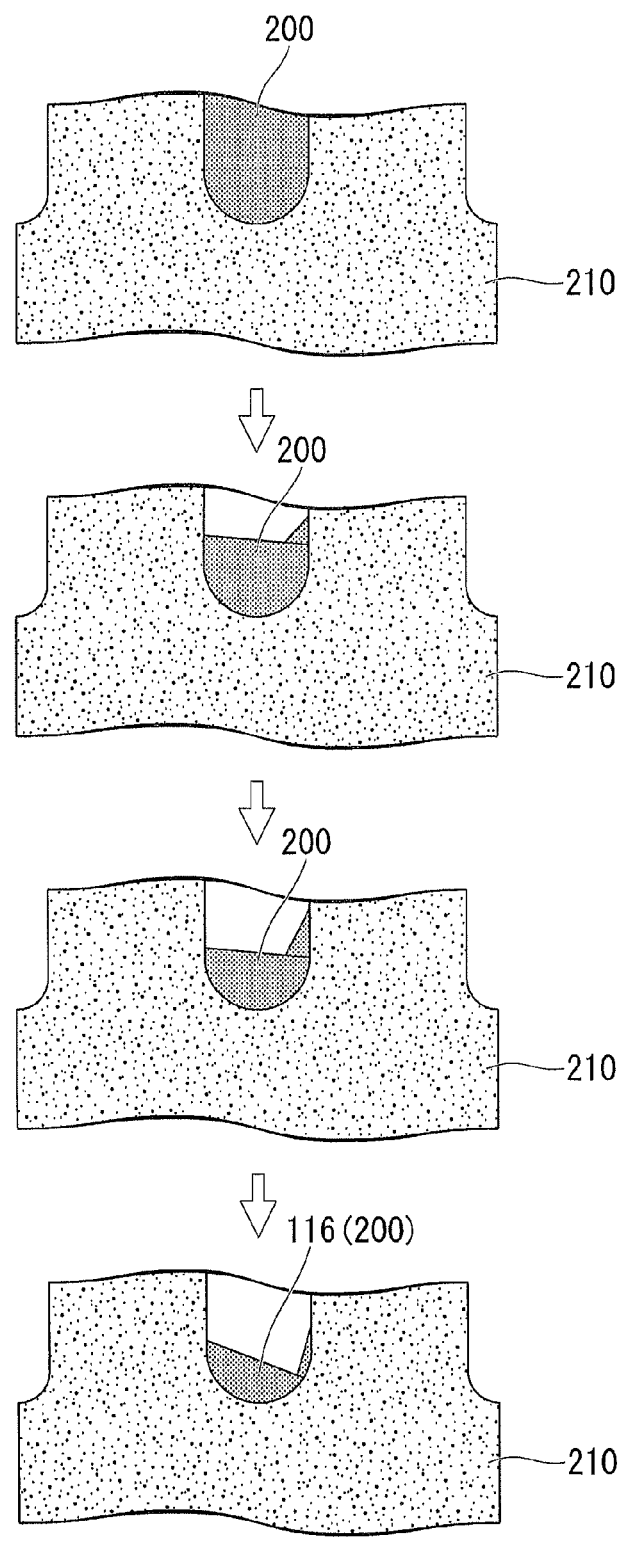
FIG. 31 is an enlarged view of crotch-portion-corresponding portion of the etching protecting film shown in FIG. 28, and is a drawing showing the progress of the etching process.

Consequently, even though the period of the etching process is the same as that of the related art, the etching residuals 16 on the crotch portion 15 located between the proximal end portions 10b and 11b of the pair of vibrating arm portions 10 and 11 are reduced in comparison with the related art as shown in FIG. 27.

Therefore, occurrence of the stress concentration caused by the etching residuals 16 is inhibited, and the high-quality piezoelectric vibration reed 1 which is resistant to damage of the vibrating arm portions 10 and 11 due to the external impact or the like is obtained. Since the problem that the lengths of the vibrating arm portions 10 and 11 are changed by the etching residuals 16 can hardly occur, stable vibration characteristics may be demonstrated.

As described above, according to the method of manufacturing the piezoelectric vibration reed of this embodiment, the etching residuals 16 on the crotch portion 15 located between the proximal end portions 10b and 11b of the pair of vibrating arm portions 10 and 11 can be reduced, and hence the high-quality piezoelectric vibration reed 1 having stable vibration characteristics and being resistant to damage of the vibrating arm portions 10 and 11 due to the external impact or the like is obtained.

In particular, since the notched portions 23 have a constant notch width along the entire notch length in the embodiment described above, the etching solution easily flows along the notched portions 23 in the longitudinal direction (L2 direction) further stably and smoothly. Therefore, the etching process can be proceeded toward the crotch-portion-corresponding portion 22a more positively, and the etching residuals 16 on the crotch portion 15 may be reduced easily.

In addition, since the notched portions 23 are formed along the center axis O, positional deviation of the etching residuals 16 to either one of the vibrating arm portions 10 and 11 can easily be prevented. Therefore, the above-described advantageous effects are achieved remarkably.

In the embodiment described above, the length and the notch width of the notched portions 23 are not limited to those described above, and may be set freely.

These values are preferably set on the basis of the crotch width T2 or a curvature R at the coupling portion between the vibrating arm portions 10 and 11 and the base portion 12.

Figure 10A:
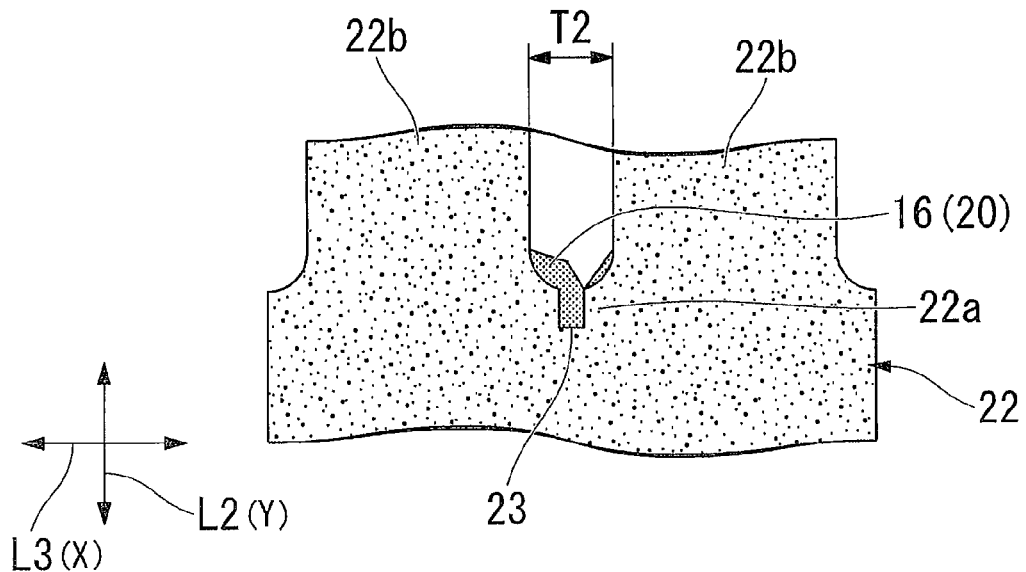
FIGS. 10A and 10B are enlarged views of the crotch-portion-corresponding portion of the mask pattern showing modifications of a notched portion.
Figure 10B:
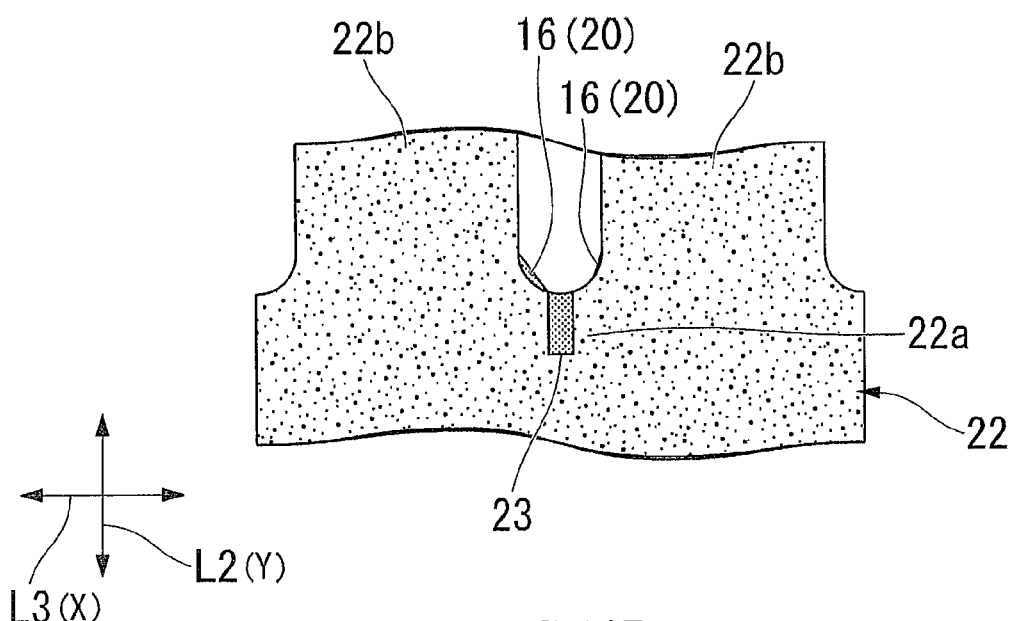

For example, as shown in FIG. 10A, if the crotch width T2 is small, the etching process is subject to the difference in etching speed between the X-axis of the crystal axis which matches the width direction (L3 direction) and the Y-axis of the recommended crystal axis which matches the longitudinal direction (L2 direction). Therefore, even when the notched portions 23 are formed, the etching residuals 16 as of the related art can easily be generated on the crotch portion 15. Therefore, in this case, by increasing the notch length of the notched portions 23 as shown in FIG. 10B, and making the flow of the etching solution to the Y-axis smoother, the progress of the etching process in the corresponding direction is encouraged, so that the etching residuals 16 can hardly be generated.

Figure 11A:
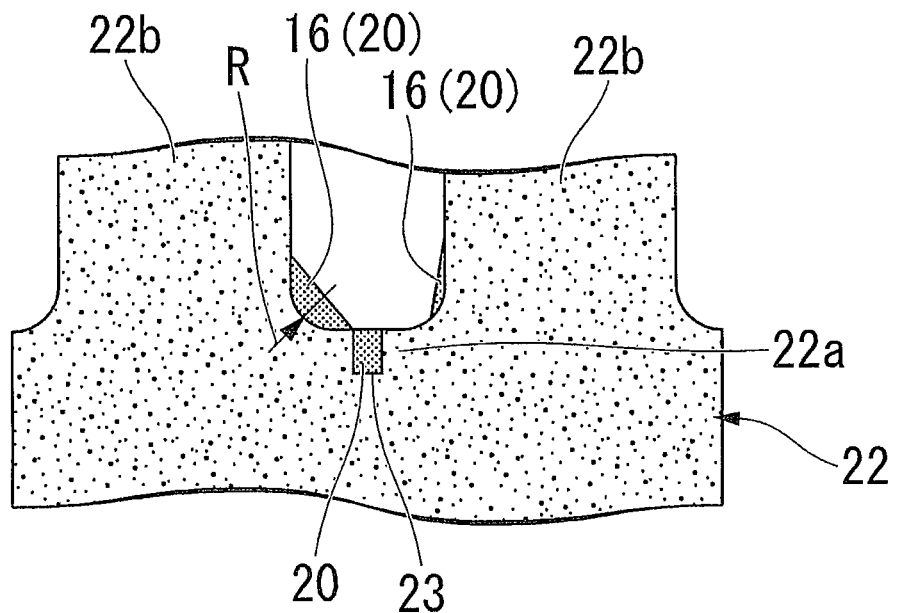
FIGS. 11A and 11B are enlarged views of the crotch-portion-corresponding portion of the mask pattern showing other modifications of the notched portion.
Figure 11B:
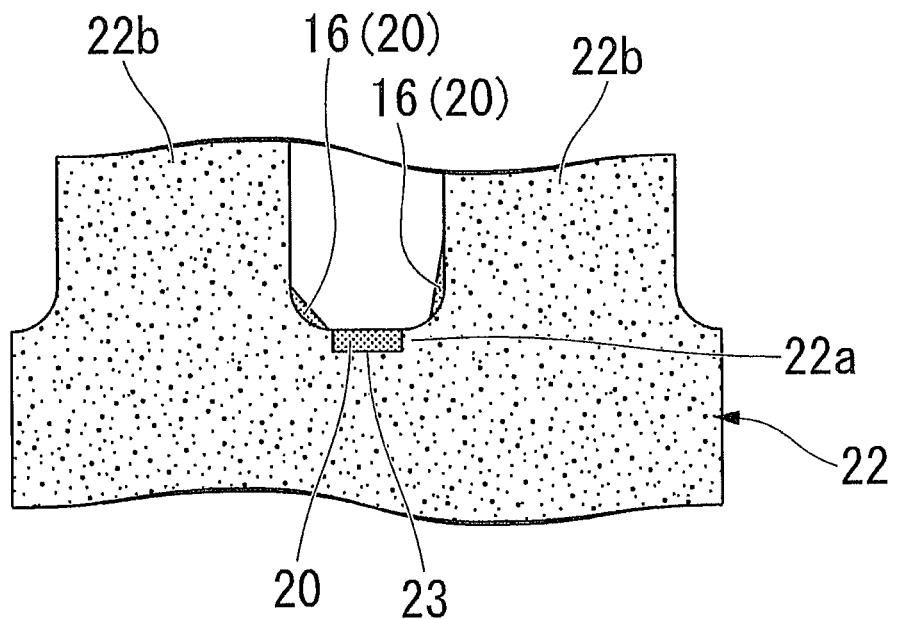

Also, as shown in FIG. 11A, for example, when the curvature R of the coupling portion between the vibrating arm portions 10 and 11 and the base portion 12 becomes smaller, the etching residuals 16 can easily be increased even when the notched portions 23 are formed. Therefore, in such a case, the notch width of the notched portions 23 is increased and the length of the notch is reduced as shown in FIG. 11B, so that the etching residuals 16 can be minimized.

The shape of the piezoelectric vibration reed 1 is not limited to the embodiment described above.

Figure 12:
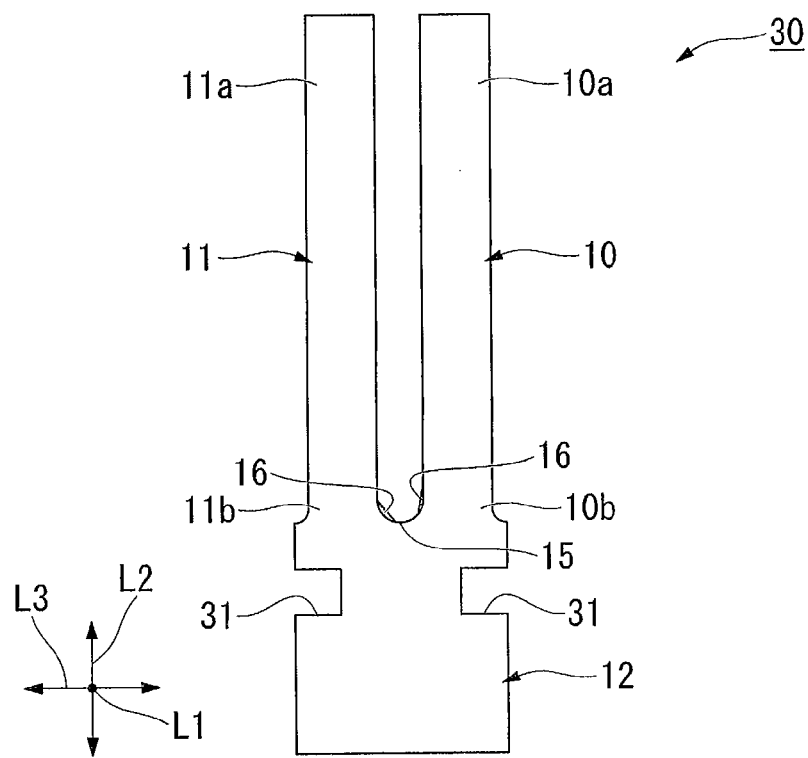
FIG. 12 is a modification of the piezoelectric vibration reed according to the invention, and is a plan view of a notch-type piezoelectric vibration reed.

For example, as shown in FIG. 12, the base portion 12 may be formed with notched portion 31 (notch) removed respectively from both side surfaces in the width direction (L3 direction) toward the center in the width direction (L3 direction) in the vicinity of the connecting portion of the vibrating arm portions 10 and 11 with respect to the proximal end portions 10b and 11b, which is so-called a notch type piezoelectric vibration reed 30.

The notched portions 31 open respectively outward in the width direction (L3 direction), and penetrate through the base portion 12 in the thickness direction. Therefore, in the base portion 12, the portion in the vicinity of the connecting portion of the vibrating arm portions 10 and 11 with respect to the proximal end portions 10b and 11b has a constricted shape which is narrower in width in comparison with other portions.

With the narrow portion formed by the notches 31, a route through which the vibrations excited by the vibrating arm portions 10 and 11 are transmitted to the base portion 12 side can be narrowed, so that the vibrations are locked on the side of the vibrating arm portions 10 and 11 and are easily inhibited from leaking toward the base portion 12. Accordingly, there is provided the piezoelectric vibration reed 30 in which the vibration leak is effectively restrained, and a CI value is prevented from increasing, whereby the deterioration of the quality of an output signal may be inhibited.

Figure 13:
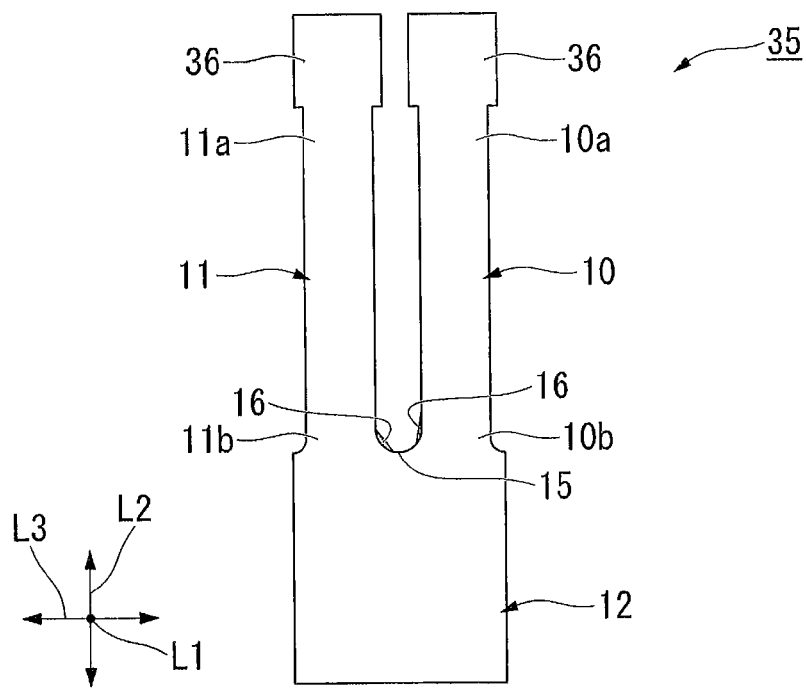
FIG. 13 is a modification of the piezoelectric vibration reed according to the invention, and is a plan view of a hammer-head type piezoelectric vibration reed.

As shown in FIG. 13, so-called a hammer-head type piezoelectric vibration reed 35 formed with hammer portions 36 having an enlarged width than other portions of the vibrating arm portions 10 and 11 on the distal end portions 10a and 11a of the vibrating arm portions 10 and 11 is also applicable.

In this case, with the hammer portions 36, the distal end portions 10a and 11a of the vibrating arm portions 10 and 11 may further be increased in weight, so that the inertia moment at the time of the vibrations may be increased. Therefore, there is provided the piezoelectric vibration reed 35 in which the vibrations of the vibrating arm portions 10 and 11 may be facilitated, and hence the length of the vibrating arm portions 10 and 11 may be reduced correspondingly, so that further downsizing can easily be achieved.

Figure 14:
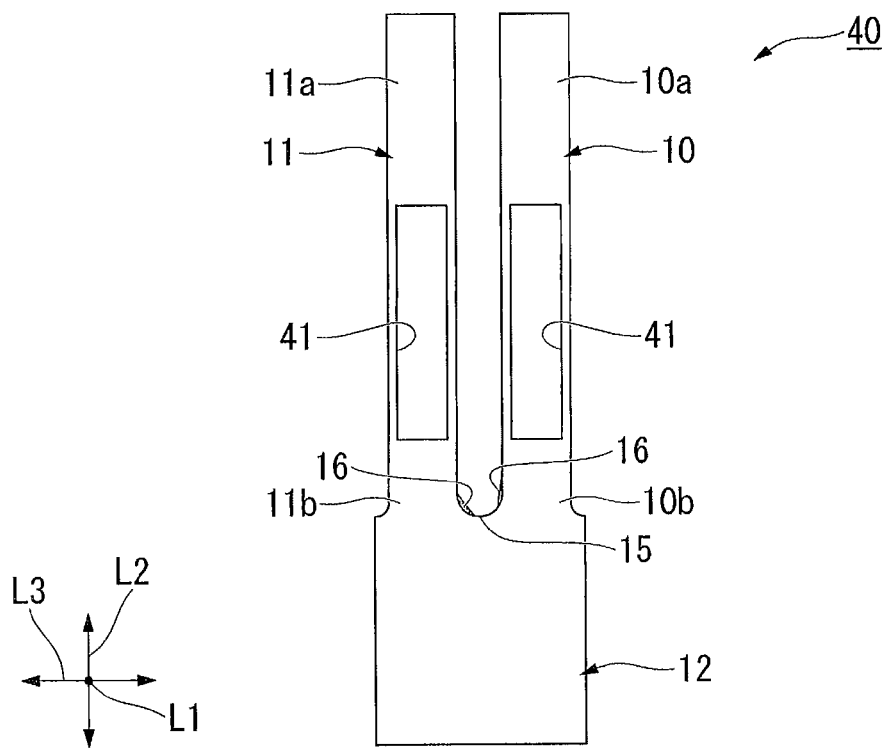
FIG. 14 is a modification of the piezoelectric vibration reed according to the invention, and is a plan view of a grooved-type piezoelectric vibration reed.

As shown in FIG. 14, a grooved-type piezoelectric vibration reed 40 formed with the groove portions 41 on the both main surfaces of the pair of vibrating arm portions 10 and 11 is also applicable.

The groove portions 41 are formed at substantially centers of the vibrating arm portions 10 and 11 along the longitudinal direction (L2 direction) of the vibrating arm portions 10 and 11. Accordingly, the vibrating arm portions 10 and 11 are formed into an H-shape in cross section.

In this case, since the excitation electrodes may be opposed each other on both sides of the groove portions 41, the electrical field may efficiently act in the direction in which the vibrating arm portions 10 and 11 move toward and away from each other. Therefore, the field efficiency may be enhanced even when the lateral width of the vibrating arm portions 10 and 11 is reduced, so that the piezoelectric vibration reed 40 suitable for downsizing is achieved.

Figure 15:
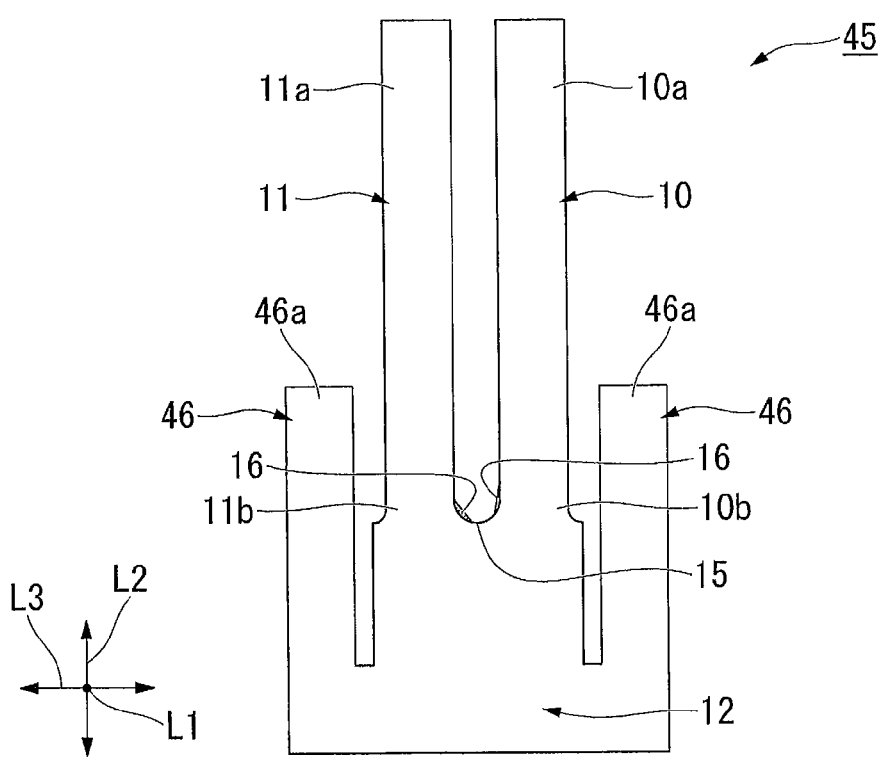
FIG. 15 is a modification of the piezoelectric vibration reed according to the invention, and is a plan view of a side arm type piezoelectric vibration reed.
Figure 16:
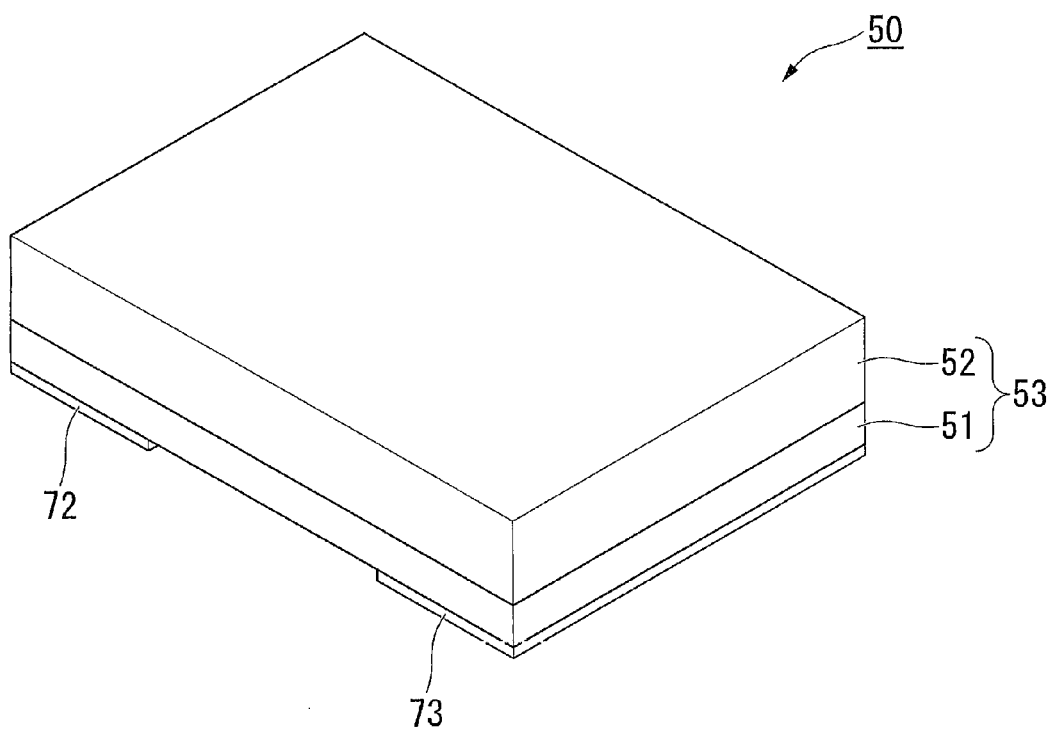
FIG. 16 is an appearance perspective view showing an embodiment of the piezoelectric vibrator according to the invention.
Figure 17:
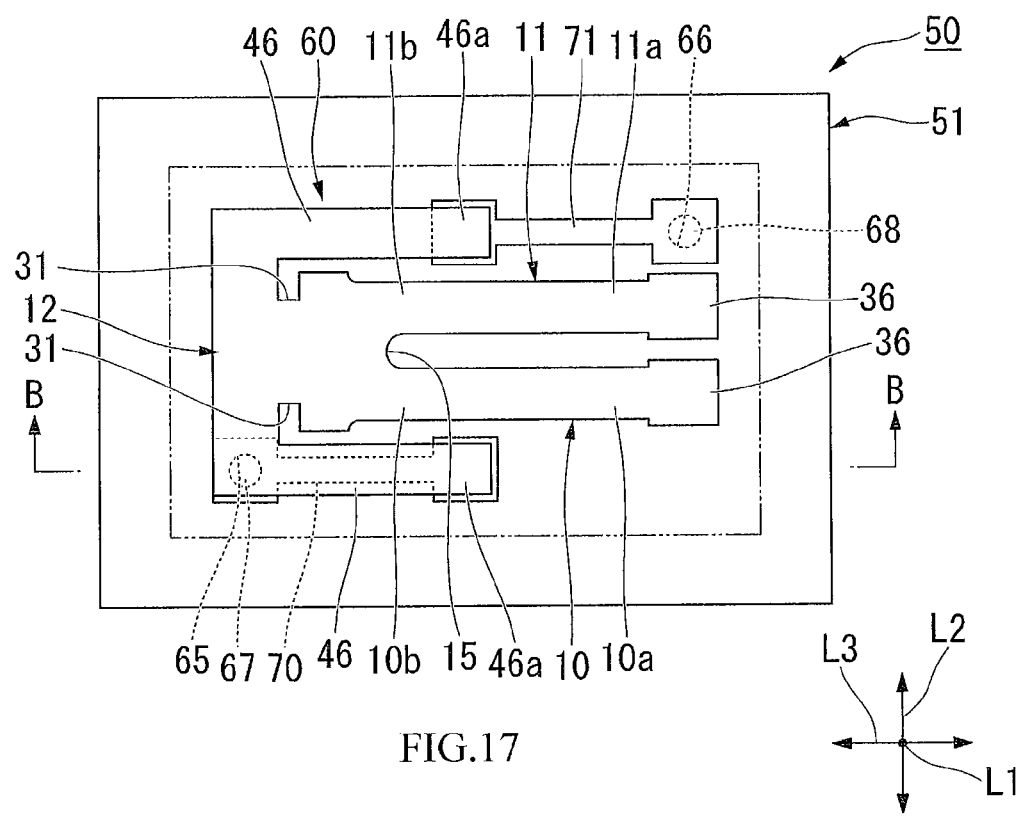
FIG. 17 is an internal configuration drawing of the piezoelectric vibrator shown in FIG. 16 and a drawing of the piezoelectric vibration reed viewed from above in a state in which a lid substrate is removed.
Figure 18:
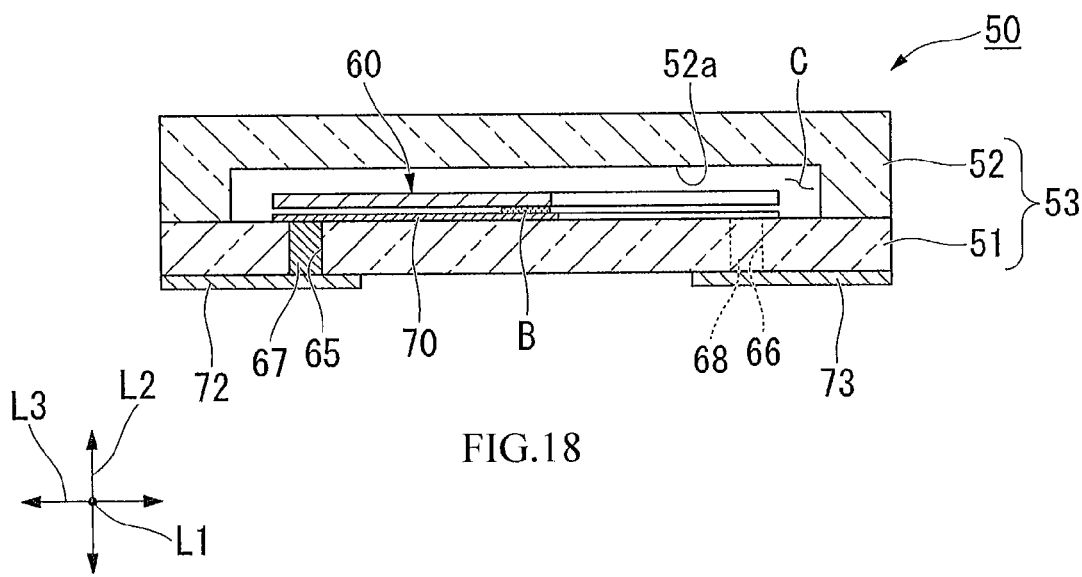
FIG. 18 is a cross-sectional view of the piezoelectric vibrator taken along the line B-B in FIG. 17.
Figure 19:
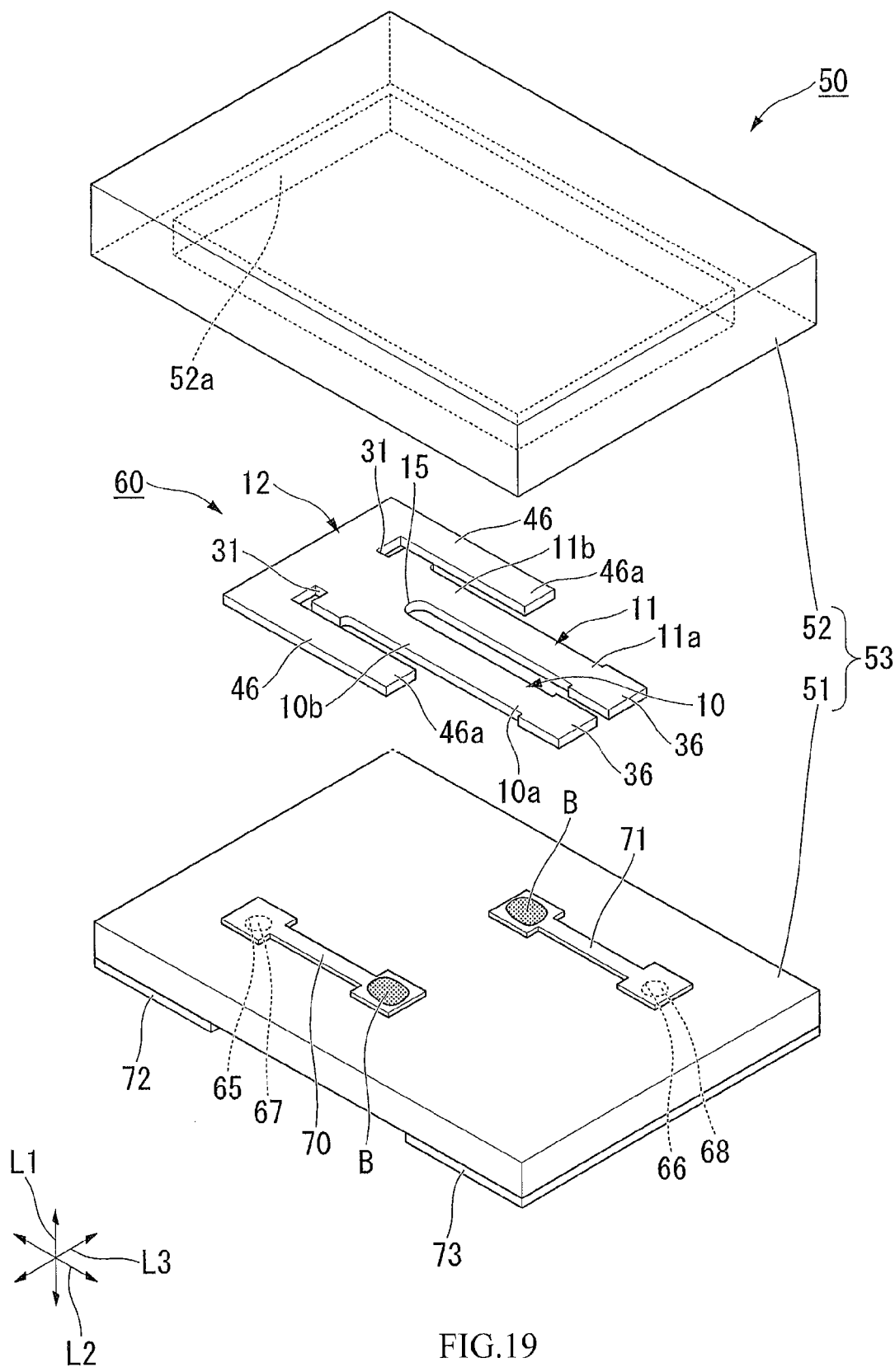
FIG. 19 is an exploded perspective view of the piezoelectric vibrator shown in FIG. 16.

Furthermore, as shown in FIG. 15, so-called a side-arm type piezoelectric vibration reed 45 in which a pair of side arms 46 extending along the longitudinal direction (L2 direction) on the both sides in the width direction (L3 direction) of the base portion 12 is formed integrally with the base portion 12 is also applicable.

More specifically, the respective side arms 46 extend from the base portion 12 toward the both sides in the width direction (L3 direction) and extend from the outer side portions toward the vibrating arm portions 10 and 11 along the longitudinal direction (L2 direction). In other words, the respective side arms 46 are positioned on the base portion 12 and both side of the proximal end portions 10b and 11b of the vibrating arm portions 10 and 11 in the width direction (L3 direction).

In this case, the distal end portions 46a of the side arms 46 can be functioned as the mount portions, and mounting on the package, for example, via the mounting portion is enabled.

In this configuration, a long distance can be secured between the connecting portions of the vibrating arm portions 10 and 11 and the mount portions (the distal end portions 46a of the side arms 46) of the base portion 12. Consequently, the vibration leak is inhibited without increasing the entire length of the piezoelectric vibration reed 45, and the CI value is inhibited from increasing, whereby the deterioration of the quality of the output signal may be inhibited.

As shown in FIG. 12 to FIG. 15, the shape of the piezoelectric vibration reed may be designed freely as long as it is of a tuning-fork type. A piezoelectric vibration reed in which the notch type shown in FIG. 12, the hammer-head type shown in FIG. 13, the grooved type shown in FIG. 14, and the side arm type shown in FIG. 15 are arbitrarily combined is also applicable.

(Piezoelectric Vibrator)

Subsequently, a piezoelectric vibrator having the piezoelectric vibration reed according to the embodiment described above will be described. Here, a case where the piezoelectric vibration reed in which the notch type, the hammer-head type, and the third arm type are combined is used as the piezoelectric vibration reed will be described as an example. However, the invention is not limited to the piezoelectric vibration reed in this case and other types of the piezoelectric vibration reeds may be used.

In this embodiment, the configuration common to portions described above is designated by the same reference numerals in the drawings and description will be omitted. In this embodiment, illustration of the etching residuals 16 on the crotch portion 15 is omitted.

As shown in FIG. 16 to FIG. 19, a piezoelectric vibrator 50 of this embodiment is of a surface-mounted type including a package 53 in which a base substrate 51 and a lid substrate 52 are joined by, for example, anode joining or joined via a joint film or the like, not shown, and the piezoelectric vibration reed 60 accommodated in a cavity C formed in the interior of the package 53.

The base substrate 51 and the lid substrate 52 are transparent insulative substrate formed of a glass material, for example, a soda-lime glass, and is formed into a substantially plate shape. The lid substrate 52 is formed with a rectangular depression 52a for accommodating the piezoelectric vibration reed 60 on the side of a joint surface where the base substrate 51 is joined. The depression 52a defines the cavity C for accommodating the piezoelectric vibration reed 60 when the base substrate 51 and the lid substrate 52 are stacked one on top of another.

The base substrate 51 is formed with a pair of through holes 65 and 66 configured to penetrate the base substrate 51 in the thickness direction. The through holes 65 and 66 are formed at positions accommodated within the cavity C. More specifically, the through holes 65 and 66 of this embodiment are such that the one through hole 65 is formed at a position corresponding to the base portion 12 of the piezoelectric vibration reed 60 mounted thereon and the other through hole 66 is formed at a position corresponding to the distal end portion 11a side of the vibrating arm portion 11.

Then, a pair of through electrodes 67 and 68 are formed in the pair of through holes 65 and 66 so as to be embedded therein. The through electrodes 67 and 68 are conductive core members fixed integrally with the through holes 65 and 66, for example, and are formed so as to be flat at both ends thereof and have the substantially same thickness as the thickness of the base substrate 51. Accordingly, the electric conductivity is secured on both surfaces of the base substrate 51 while maintaining air-tightness in the cavity C.

The through electrodes 67 and 68 are not limited to the case described above, and may be formed, for example, by inserting metal pins, not shown, in the through holes 65 and 66 and then filling glass frit between the through holes 65 and 66 and the metal pins and sintering the same. Furthermore, a conductive adhesive agent embedded in the through holes 65 and 66 is also applicable.

A pair of drawing electrodes 70 and 71 are patterned using a conductive material on an upper side (the side of a joint surface to which the lid substrate 52 is joined) of the base substrate 51. The drawing electrode 70, which is the one of the pair of drawing electrodes 70 and 71 covers the through electrode 67 on one end side, and extends on the other end side thereof toward the center portion of the base substrate 51 in the longitudinal direction (L2 direction). The other drawing electrode 71 covers the through electrode 68 at one end side, and extends on the other end side thereof toward the center portion of the base substrate 51 in the longitudinal direction (L2 direction). Therefore, the other end sides of the respective drawing electrodes 70 and 71 are arranged at the same positions of the base substrate 51 in the longitudinal direction (L2 direction), more specifically, at positions corresponding to the distal end portions 46a of the side arms 46 of the piezoelectric vibration reed 60.

Then, bumps B formed of gold or the like respectively are formed on the other end sides of the pair of drawing electrodes 70 and 71. The piezoelectric vibration reed 60 is mounted in a state in which the mount electrode of the base portion 12 is in contact with the bumps B. Accordingly, the piezoelectric vibration reed 60 is supported in a state of coming off an upper surface of the base substrate 51, and is in a state of being electrically connected to the respective drawing electrodes 70 and 71.

In this embodiment, the mount electrode is formed on the distal end portions 46a of the side arms 46, and the mount electrode is connected to the drawn electrodes 70 and 71 via the bumps B.

External electrodes 72 and 73 to be electrically connected respectively to the pair of through electrodes 67 and 68 are formed on the lower surface of the base substrate 51.

When activating the piezoelectric vibrator 50 configured in this manner, a predetermined drive voltage is applied to the external electrodes 72 and 73 formed on the base substrate 51. Accordingly, a current is passed through the excitation electrode of the piezoelectric vibration reed 60, so that the pair of vibrating arm portions 10 and 11 may be vibrated in the direction toward and away from each other at a predetermined frequency. Then, the piezoelectric vibrator 50 may be used as a time-of-day source, a timing source of a control signal, or a reference signal source using the vibrations of the pair of vibrating arm portions 10 and 11.

According to the piezoelectric vibrator 50 of this embodiment, since the high-quality piezoelectric vibration reed 60 having stable vibration characteristics and being resistant to damage of the vibrating arm portions 10 and 11 due to the external impact is provided, the high-quality piezoelectric vibration reed 50 improved in reliability in operation and durability is provided.

(Oscillator)

Subsequently, an embodiment of the oscillator according to the invention will be described with reference to FIG. 20.

Figure 20:
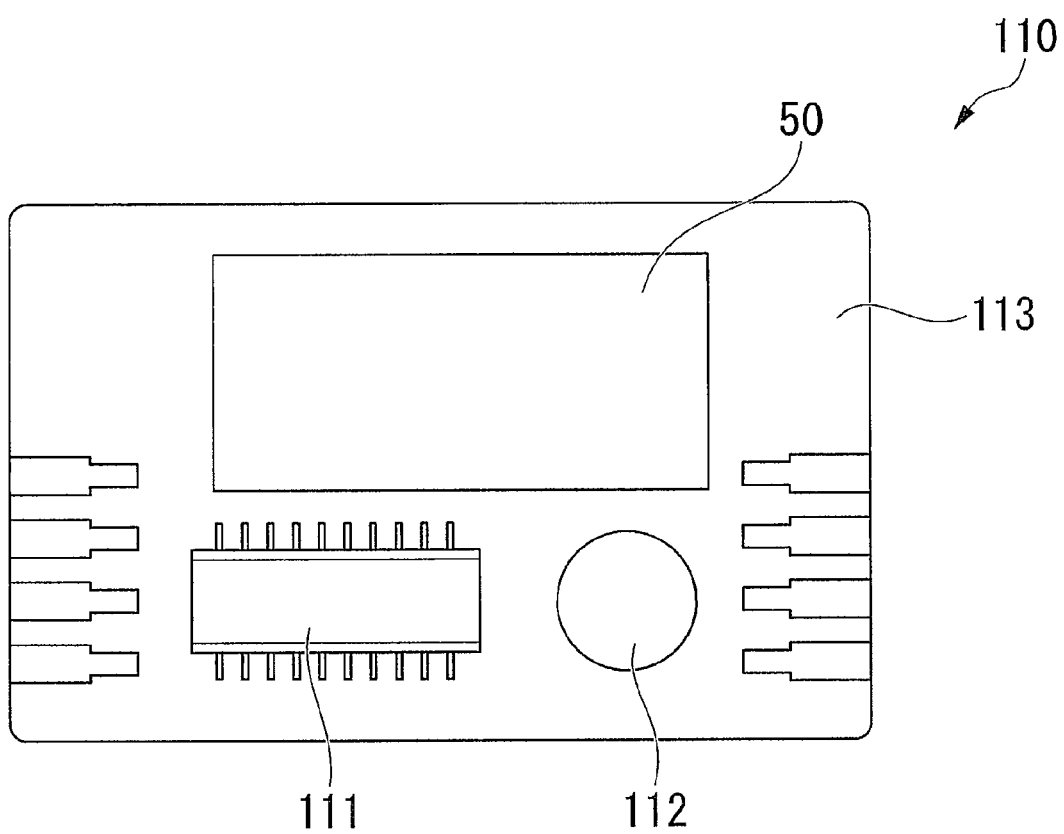
FIG. 20 is a configuration drawing showing an embodiment of an oscillator according to the invention.

An oscillator 100 of this embodiment includes the piezoelectric vibrator 50 configured as an oscillating element electrically connected to an integrated circuit 101 as shown in FIG. 20. The oscillator 100 includes a substrate 103 on which an electronic component 102 such as a capacitor is mounted. The substrate 103 includes the integrated circuit 101 described above for the oscillator mounted thereon, and the piezoelectric vibrator 50 is mounted in the vicinity of the integrated circuit 101. The electronic component 102, the integrated circuit 101, and the piezoelectric vibrator 50 are electrically connected respectively by a wiring pattern, not shown. The respective components are molded by a resin, not shown.

In the oscillator 100 configured in this manner, when a voltage is applied to the piezoelectric vibrator 50, the piezoelectric vibration reed 60 in the piezoelectric vibrator 50 vibrates. This vibration is converted into an electric signal by the piezoelectric property of the piezoelectric vibration reed 60, and is input to the integrated circuit 101 as the electric signal. The input electric signal is subjected to various processes by the integrated circuit 101 and is output as a frequency signal. Accordingly, the piezoelectric vibrator 50 functions as an oscillating element.

In addition, by selectively setting the configuration of the integrated circuit 101, that is, RTC (Real Time Clock) modules according to the request, in addition to the function of a single-function oscillator for a time piece, a function to control the date and time of operation of the single-function oscillator for a time piece or external instruments or a function to provide the time of day or a calendar may be added.

As described above, according to the oscillator 100 of this embodiment, since the downsized piezoelectric vibrator 50 described above is provided, the oscillator 100 improved in reliability of operation and durability is provided.

(Electronic instrument)

Figure 21:
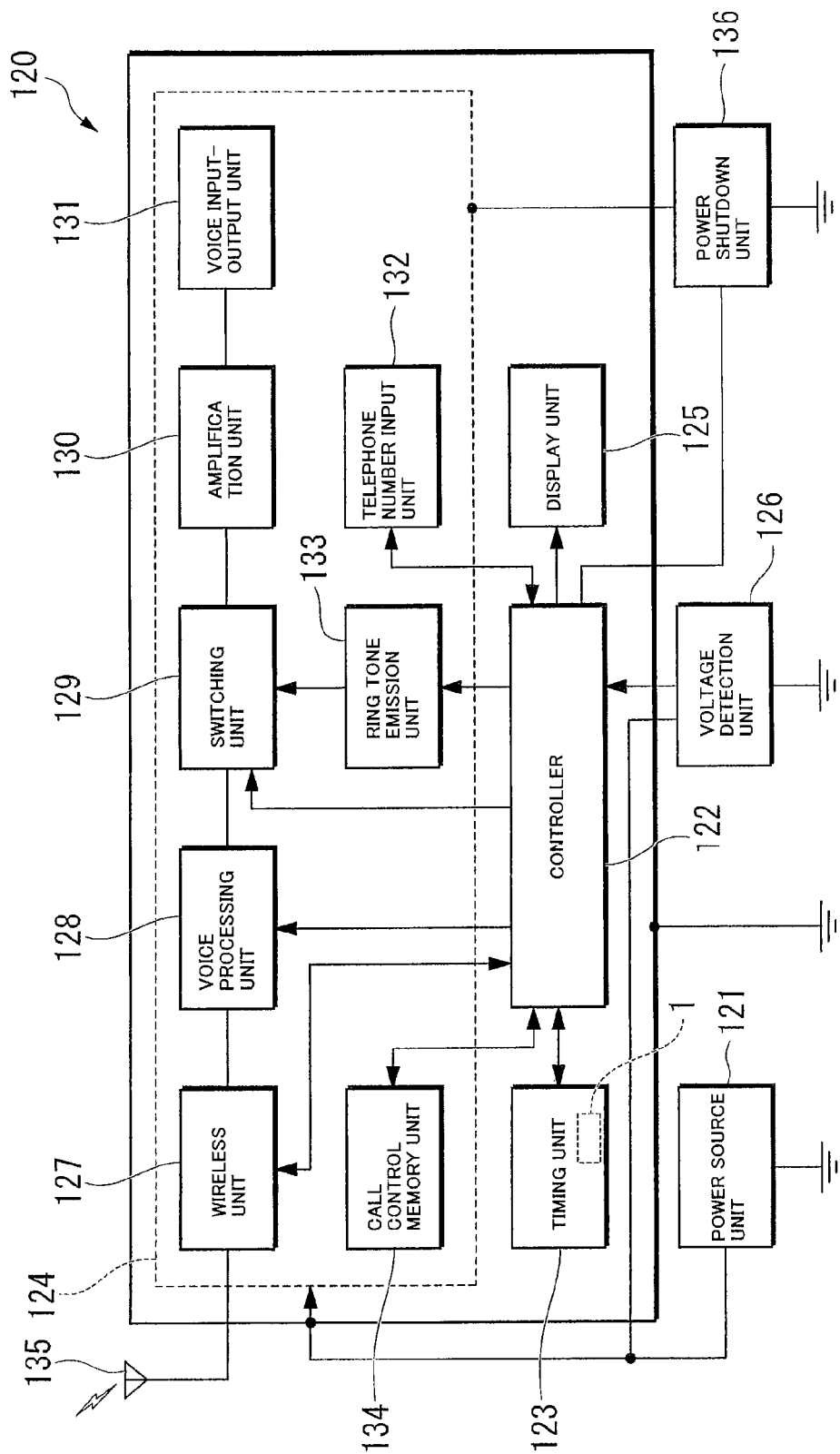
FIG. 21 is a configuration drawing showing an embodiment of an electronic instrument according to the invention.

Referring now to FIG. 21, an embodiment of the electronic instrument according to the invention will be described. A portable digital assistant device (electronic instrument) 110 having the piezoelectric vibrator 50 described above as the electronic instrument will be described as an example.

The portable digital assistant device 110 of this embodiment is represented, for example, by a mobile phone, which is a developed and improved wrist watch of the related art. An appearance is similar to the wrist watch, including a liquid crystal display at a portion corresponding to a dial, which is configured to display current time or the like on a screen thereof. When used as a communication instrument, the same communication as the mobile phones of the related art may be performed by removing the same from the wrist and using a speaker and a microphone integrated in a portion inside a band. However, downsizing and reduction in weight are dramatically achieved in comparison with the mobile phones of the related art.

Subsequently, a configuration of the portable digital assistant device 110 of this embodiment will be described. The portable digital assistant device 110 includes the piezoelectric vibrator 50 and a power source unit 111 configured to supply power as shown in FIG. 21. The power source unit 111 is formed of, for example, a lithium secondary cell. The power source unit 111 includes a control unit 112 configured to perform various types of control, a clocking unit 113 configured to count time of day or the like, a communication unit 114 configured to perform communication with the outside, a display unit 115 configured to display various items of information, and a voltage detection unit 116 configured to detect the voltage of the respective functional portions are connected in parallel to each other. Then, the power is supplied to the respective functional portions by the power source unit 111.

The control unit 112 performs sending and receiving of voice data, counting and display of the current time of day, and control of the operation of the entire system by controlling the respective functional portions. The control unit 112 includes an ROM in which a program is written in advance, a CPU configured to read out and execute the program written in the ROM, and an RAM used as a work area for the CPU.

The clocking unit 113 includes an integrated circuit having an oscillation circuit, a register circuit, a counter circuit, and an interface circuit integrated therein, and the piezoelectric vibrator 50. When a voltage is applied to the piezoelectric vibrator 50, the piezoelectric vibration reed 60 vibrates, and the vibration thereof is converted into an electric signal by the piezoelectric property of crystal, and is input to the oscillation circuit as the electric signal. The output of the oscillation circuit is binarized and is counted by the register circuit and the counter circuit. Then, sending and receiving of the signal with respect to the control unit 112 is performed via the interface circuit, and the current time of day, the current date, calendar information or the like are displayed on the display unit 115.

The communication unit 114 has the same function as the mobile phones of the related art, and includes a wireless unit 117, a voice processing unit 118, a switch unit 119, an amplifying unit 120, a voice input/output unit 121, a phone number input unit 122, a ring tone generating unit 123, and a call control memory unit 124.

The wireless unit 117 performs sending and receiving of various types of data such as voice data with respect to a base station via an antenna 125. The voice processing unit 118 codes and decodes the voice signal input from the wireless unit 117 or the amplifying unit 120. The amplifying unit 120 amplifies the signal input from the voice processing unit 118 or the voice input/output unit 121 to a predetermined level. The voice input/output unit 121 is formed of a speaker, a microphone, or the like, and is configured to amplify a ring tone or a receiving voice, or collect a voice.

The ring tone generating unit 123 generates the ring tone according to a call from the base station. The switch unit 119 switches the amplifying unit 120 connected to the voice processing unit 118 to the ring tone generating unit 123 only at the time of incoming call, so that the ring tone generated by the ring tone generating unit 123 is output to the voice input/output unit 121 via the amplifying unit 120.

The call control memory unit 124 stores a program relating to control of incoming and outgoing call of communication. The phone number input unit 122 includes, for example, numerical key from 0 to 9 and other keys, and is configured to input a telephone number of the called party by pushing these numerical key or the like.

The voltage detection unit 116 detects voltage drop when the voltage applied to the receptive functional portions such as the control unit 112 by the power source unit 111 is less than the predetermined value, and notifies the same to the control unit 112. The predetermined voltage value at this time is a value preset as a minimum required voltage for keeping a stable operation of the communication unit 114 and, for example, on the order of 3V. The control unit 112 which receives the notification of the voltage drop from the voltage detection unit 116 prohibits the wireless unit 117, the voice processing unit 118, the switch unit 119, and the ring tone generating unit 123 from operating. In particular, the stop of the operation of the wireless unit 117 which consumes a large amount of power is essential. Then, the effect that the communication unit 114 is disabled due to insufficient remaining battery power is displayed on the display unit 115.

In other words, the operation of the communication unit 114 is prohibited by the voltage detection unit 116 and the control unit 112, and that effect may be displayed on the display unit 115. This display may be a literal message. However, as more intuitive display, a cross mark (x) may be shown on a phone icon displayed on an upper portion of a display surface of the display unit 115.

With the provision of a power source blocking unit 126 which is capable of selectively blocking the electric power of a portion relating to the function of the communication unit 114, the function of the communication unit 114 may be stopped further reliably.

As described above, according to the portable digital assistant device 110 of this embodiment, since the piezoelectric vibrator 50 described above is provided, the portable digital assistant device 110 improved in reliability of operation and durability is provided.

(Radio Timepiece)

Figure 22:
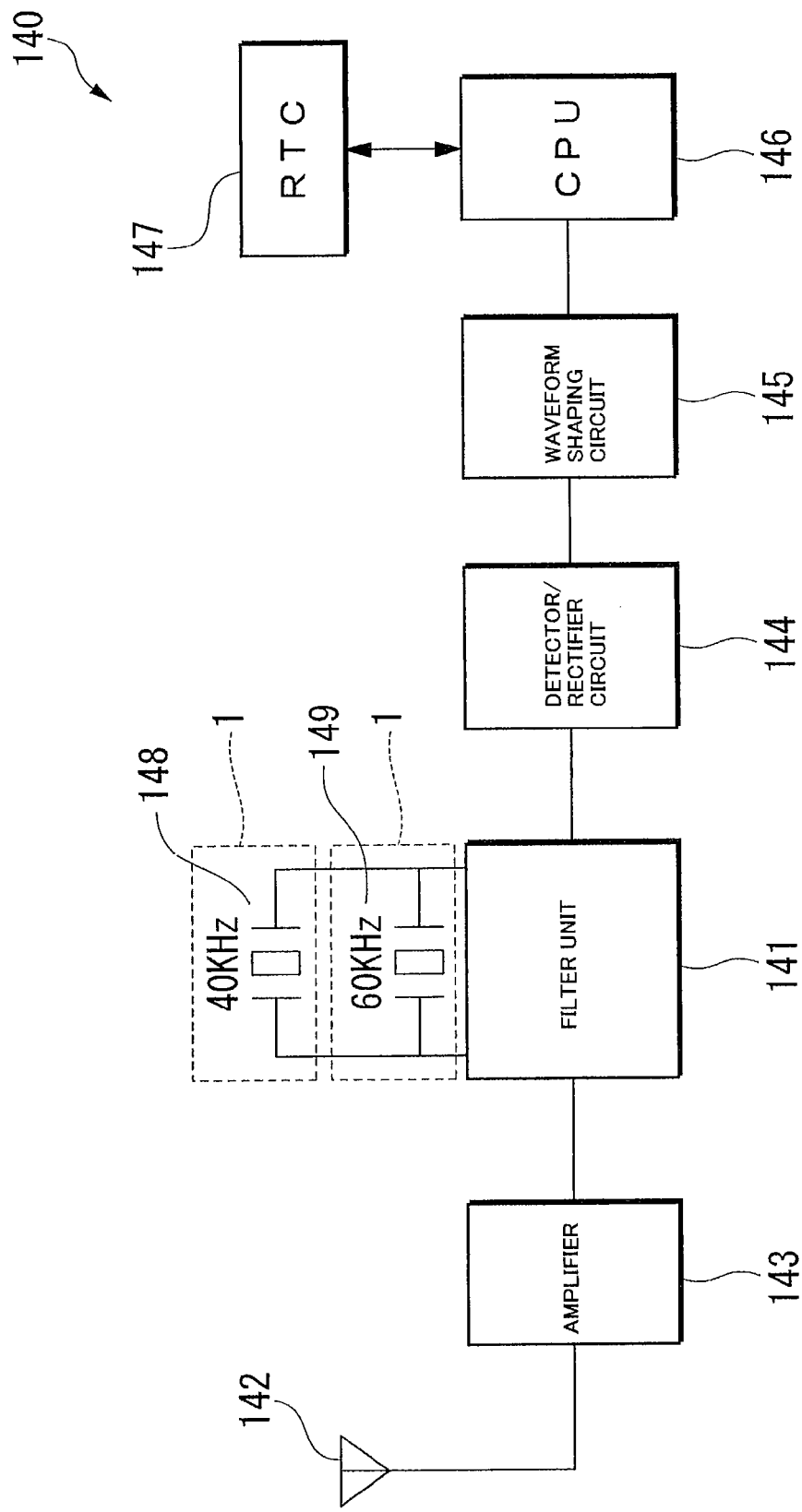
FIG. 22 is a configuration drawing showing an embodiment of a radio timepiece according to the invention.
Figures 23, 24:
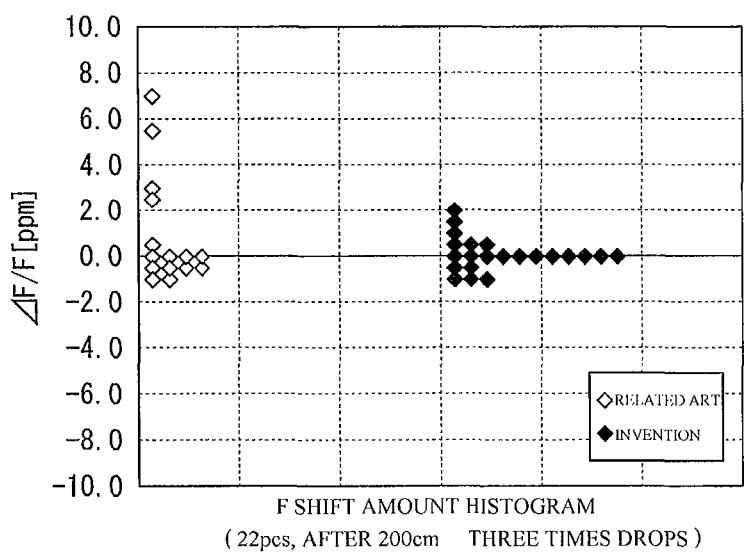
FIG. 23 is a drawing showing a result of test corresponding to an example of the piezoelectric vibration reed of the invention.
FIG. 24 is a drawing showing a result of test corresponding to the example of the piezoelectric vibration reed of the invention.
Figures 25, 26:
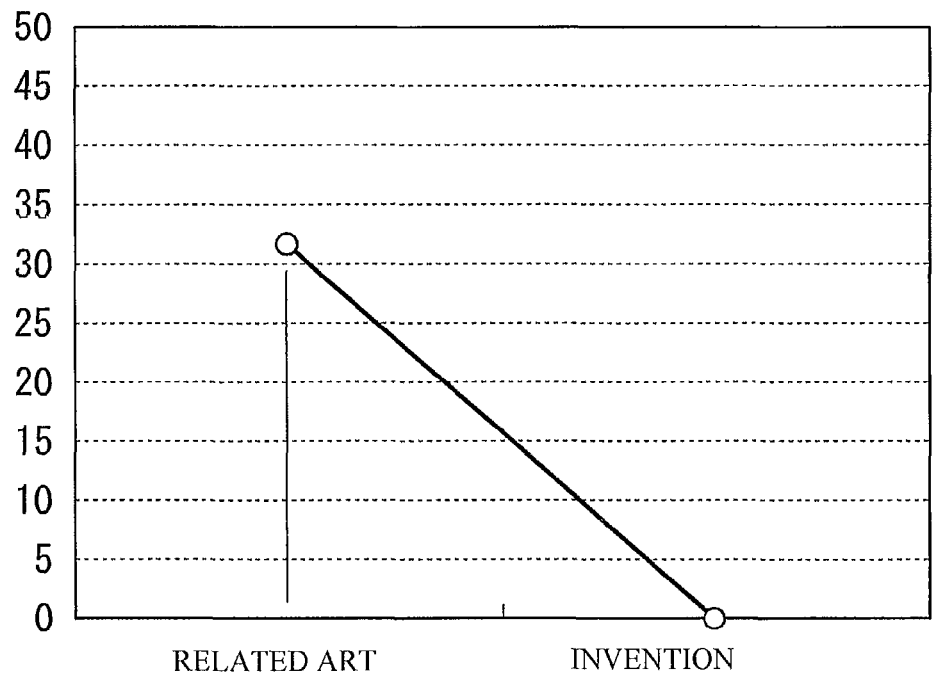
FIG. 25 is a drawing showing a result of test corresponding to the example of the piezoelectric vibration reed of the invention.
FIG. 26 is a drawing showing a result of test corresponding to the example of the piezoelectric vibration reed of the invention.

Referring now to FIG. 22, an embodiment of a radio timepiece according to the invention will be described.

A radio timepiece 140 of this embodiment includes the piezoelectric vibrator 50 electrically connected to a filter 141 as shown in FIG. 22, and is a timepiece having a function to receive standard radio waves including timepiece information and display an accurate time-of-day automatically corrected.

In Japan, there are two transmitting stations (transmitter stations) which transmit standard radio waves in Fukushima prefecture (40 kHz) and Saga prefecture (60 kHz), and transmit respective standard radio waves. Since long waves such as 40 kHz or 60 kHz have both a property to propagate the ground surface and a property to propagate while being reverberated between an ionization layer and the ground surface, a wide range of the propagation is achieved, so that the above-described two transmitting stations cover entire part of Japan.

Hereinafter, a functional configuration of the radio timepiece 140 will be described in detail.

An antenna 142 receives a long standard radio wave of 40 kHz or 60 kHz. The long standard radio wave is time information referred to as time code subjected to an AM modulation to a carrier wave of 40 kHz or 60 kHz. The received long standard radio wave is amplified by an amplifier 143 and is filtered and synchronized by the filter 141 having a plurality of the piezoelectric vibrators 50.

The piezoelectric vibrators 50 of this embodiment include quartz vibrator units 148 and 149 having resonant frequencies of 40 kHz and 60 kHz which are the same as the above-described carrier frequencies, respectively.

In addition, a signal filtered and having a predetermined frequency is subjected to detection and demodulation by a detection and rectification circuit 134. Subsequently, the time code is acquired via a waveform shaping circuit 145, and is counted by a CPU 146. The CPU 146 reads information such as the current year, day of year, day of the week, time of day, and the like. The read information is reflected on an RTC 147, and a correct time of day information is displayed.

Since the carrier wave has 40 kHz or 60 kHz, vibrators having the above-described tuning-fork type structure are suitable for the quartz vibrator units 148 and 149.

The above-described description is based on an example in Japan, and the frequencies of the long standard radio waves are different in foreign countries. For example, in Germany, a standard radio wave of 77.5 kHz is used. Therefore, when integrating the radio timepiece 140 which is compatible with foreign countries in mobile apparatuses, another piezoelectric vibrator 50 having a frequency different from that in Japan is required.

As described above, according to the radio timepiece 140 of this embodiment, since the piezoelectric vibrator 50 described above is provided, the radio timepiece 140 improved in reliability of operation and durability is provided.

Although the embodiments of the invention have been described in detail referring to the drawings, detailed configurations are not limited to these embodiments, and modifications in design without departing the scope of the invention are also included.

For example, in the embodiments described above, the piezoelectric vibration reed in the invention is employed as the surface-mounted piezoelectric vibrator 50. However, the invention is not limited thereto, and the piezoelectric vibration reed of the invention may be used for the piezoelectric vibrator of a cylinder package type.

In addition, the configurations described above may be sorted out or may be changed to other configurations as needed without departing the scope of the invention.

(Example)

Here, an example in which the piezoelectric vibration reed 1 of the above-described embodiment shown in FIG. 1 and the piezoelectric vibration reed of the related art were dropped from a height of 200 cm, and how much the resonant frequency F was shifted before and after and whether or not damage occurred or not are actually confirmed will be described.

The term "damage" here means damage including cracks or breakages of the vibrating arm portions 10 and 11 due to the concentration of a stress caused by the etching residuals 16.

Both of the piezoelectric vibration reed 1 according to the invention and the piezoelectric vibration reed of the related art are manufactured from the crystal wafer 20, and the size and the shape thereof are the same. However, the piezoelectric vibration reed 1 according to the invention is different from the related art in that formation of the contours is achieved by performing the etching process by Wet Etching using the mask pattern 22 formed with the notched portions 23.

The drop test described above was performed for the piezoelectric vibration reed 1 according to the invention and the piezoelectric vibration reed of the related art under the same conditions, and twenty-two samples each were used for the test. In this case, the drop test was repeated three times for one sample.

Consequently, as shown in FIG. 23 to FIG. 26, no damage was confirmed and the breakage rate was 0% in the case of the piezoelectric vibration reed 1 according to the invention. In contrast, in the case of the piezoelectric vibration reed of the related art, 7 samples out of 22 samples were broken, and the breakage rate was 31.8%.

As regards a shift amount (ppm) of the resonant frequency, it was confirmed that the shift amount of the piezoelectric vibration reed of the related art was apparently larger than that of the piezoelectric vibration reed 1 according to the invention.

From these reasons, according to the invention, advantageous effects that the etching residuals 16 on the crotch portion 15 are smaller than that of the related art, whereby the piezoelectric vibration reed 1 having the advantageous effects that the stable vibration characteristics are provided, and being resist to damage of the vibrating arm portions 10 and 11 due to the external impact is obtained were actually confirmed.

I claim:

1. A method of manufacturing a piezoelectric vibration reed comprising a pair of vibrating arm portions in parallel to each other with a crotch portion located between proximal end portions of the pair of vibrating arm portions and a base portion configured to integrally support the proximal end portions of the pair of vibrating arm portions in a longitudinal direction of the vibrating arm portions, the method comprising:

forming a contour of the piezoelectric vibration reed from a piezoelectric wafer, comprising:

forming a photolithographic mask pattern by forming an etching protection film on both main surfaces of the piezoelectric wafer, the mask pattern corresponding to a contour of the piezoelectric vibration reed, the mask pattern including a slit-shaped notched portion extending through the base portion along the longitudinal direction, the notched portion formed at the crotch portion, and wet etching both main surfaces using the mask pattern as an etching mask and forming the slit-shaped notched portion, the slit-shaped notched portion having a constant width along the longitudinal direction.

2. The method of claim 1, wherein the wet etching is performed on the piezoelectric wafer along the shape of the mask pattern, so that the contour of the piezoelectric vibration reed is formed.

3. The method of claim 1, wherein wet etching both main surfaces comprises flowing an etching solution in the longitudinal direction of the pair of vibrating arm portions along the slit-shaped notched portion, thereby reducing etching residuals on the crotch portion.

4. The method of claim 1, further comprising determining a width and a length of the slit-shaped notched portion based on a curvature R of the crotch portion.

5. The method of claim 1, wherein a width of the slit-shaped notched portion is on the order of ⅓ of the distance between the pair of vibrating arm portions.

* * * * *